(12) United States Patent
Yao

(10) Patent No.: US 11,888,321 B2
(45) Date of Patent: Jan. 30, 2024

(54) POWER CONVERSION APPARATUS AND METHOD FOR CONTROLLING OUTPUT IMPEDANCE OF POWER CONVERSION APPARATUS

(71) Applicant: Huawei Digital Power Technologies Co., Ltd., Shenzhen (CN)

(72) Inventor: Xiofeng Yao, Xi'an (CN)

(73) Assignee: Huawei Digital Power Technologies Co.., Ltd., Shenzhen (CN)

( * ) Notice: Subject to any disclaimer, the term of this patent is extended or adjusted under 35 U.S.C. 154(b) by 183 days.

(21) Appl. No.: 17/405,465

(22) Filed: Aug. 18, 2021

(65) Prior Publication Data
US 2021/0384731 A1 Dec. 9, 2021

Related U.S. Application Data

(63) Continuation of application No. PCT/CN2019/128022, filed on Dec. 24, 2019.

(30) Foreign Application Priority Data

Feb. 28, 2019 (CN) .......................... 201910152938.8

(51) Int. Cl.
| | |
|---|---|
| *H02J 3/38* | (2006.01) |
| *H02M 1/36* | (2007.01) |
| *H02M 7/48* | (2007.01) |
| *H02S 40/32* | (2014.01) |
| *H02S 50/10* | (2014.01) |

(52) U.S. Cl.
CPC ................. *H02J 3/38* (2013.01); *H02M 1/36* (2013.01); *H02M 7/48* (2013.01); *H02S 40/32* (2014.12); *H02S 50/10* (2014.12)

(58) Field of Classification Search
None
See application file for complete search history.

(56) References Cited

U.S. PATENT DOCUMENTS

| | | | |
|---|---|---|---|
| 5,179,488 A | 1/1993 | Rovner | |
| 5,710,699 A | 1/1998 | King et al. | |
| 2008/0191675 A1* | 8/2008 | Besser | H02J 7/35 323/234 |

(Continued)

FOREIGN PATENT DOCUMENTS

| | | |
|---|---|---|
| CN | 102598494 A | 7/2012 |
| CN | 203456874 U | 2/2014 |

(Continued)

*Primary Examiner* — Jared Fureman
*Assistant Examiner* — Aqeel H Bukhari
(74) *Attorney, Agent, or Firm* — Maier & Maier, PLLC

(57) ABSTRACT

A power conversion apparatus and a method for controlling an output impedance of a power conversion apparatus are provided to resolve a prior-art problem of relatively low accuracy of a method for determining a working status of a power conversion apparatus. The method includes: adjusting the output impedance of the power conversion apparatus to a first impedance when the power conversion apparatus does not satisfy a start condition; or adjusting the output impedance of the power conversion apparatus to a second impedance when the power conversion apparatus satisfies a start condition, where the first impedance is not equal to the second impedance.

20 Claims, 8 Drawing Sheets

(56) References Cited

U.S. PATENT DOCUMENTS

| | | | |
|---|---|---|---|
| 2009/0147423 A1 | 6/2009 | Mulligan et al. | |
| 2011/0005567 A1* | 1/2011 | VanderSluis | H02J 3/381 |
| | | | 136/244 |
| 2012/0026631 A1 | 2/2012 | Kazemi et al. | |
| 2012/0063048 A1 | 3/2012 | Divan | |
| 2013/0307336 A1 | 11/2013 | Bundschuh et al. | |
| 2020/0169217 A1* | 5/2020 | Oomori | H02M 3/155 |
| 2020/0220357 A1* | 7/2020 | Fujiwara | H02S 40/32 |

FOREIGN PATENT DOCUMENTS

| | | | |
|---|---|---|---|
| CN | 105610306 A | 5/2016 | |
| CN | 105915156 A | 8/2016 | |
| CN | 105958934 A | 9/2016 | |
| CN | 105978476 A | 9/2016 | |
| CN | 106877311 A | 6/2017 | |
| CN | 104079001 B | 8/2017 | |
| CN | 107370384 A | 11/2017 | |
| CN | 207819564 U | 9/2018 | |
| CN | 109039085 A | 12/2018 | |
| CN | 109831107 A | 5/2019 | |
| CN | 110429643 B | 7/2021 | |
| DE | 102011014133 A1 | 9/2012 | |
| EP | 1798845 A1 | 6/2007 | |
| EP | 2444872 A2 | 4/2012 | |
| JP | 2005080369 A | 3/2005 | |
| KR | 1020050049031 A | 5/2005 | |
| WO | 2011092606 A1 | 8/2011 | |
| WO | 2017212757 A1 | 12/2017 | |

\* cited by examiner

POWER CONVERSION APPARATUS AND METHOD FOR CONTROLLING OUTPUT IMPEDANCE OF POWER CONVERSION APPARATUS

CROSS-REFERENCE TO RELATED APPLICATIONS

This application a continuation of International Application No. PCT/CN2019/128022, filed on Dec. 24, 2019, which claims priority to Chinese Patent Application No. 201910152938.8, filed on Feb. 28, 2019. The disclosures of the aforementioned applications are hereby incorporated by reference in their entireties.

TECHNICAL FIELD

Embodiments relate to the field of power converter technologies, and in particular to, a power conversion apparatus and a method for controlling an output impedance of a power conversion apparatus.

BACKGROUND

Photovoltaic (PV) power generation is the most common solar energy utilization manner in which light energy can be directly converted into electrical energy. PV power generation features high reliability, a long lifespan, environmental protection, and the like. As shown in FIG. 1, a photovoltaic power system generally includes photovoltaic modules, optimizers, and an inverter. An input end of the optimizer is connected to an output end of the photovoltaic module, and the optimizer is configured to implement maximum power tracking of the photovoltaic module or rapid power-off. Output ends of a plurality of optimizers are connected in series and then connected to a direct current input end of the inverter, so that output power of the optimizers in series can be adjusted. An alternating current output end of the inverter is connected to a power grid for grid-connected power generation.

In a scenario in which a photovoltaic power system includes optimizers, there are many field wiring cases, and the optimizers are usually installed on rear faces of photovoltaic modules (for example, fastened on supports of the photovoltaic modules or frames of the photovoltaic modules). Whether a single optimizer can normally work needs to be determined after the optimizer is installed, and whether the optimizers in series can normally work needs to be determined after the photovoltaic modules in series and the optimizers in series are installed. In this way, normal installation can be ensured after installation and construction of the photovoltaic modules and the optimizers are completed, and checking of related wiring required due to an optimizer installation problem does not need to be subsequently performed. This avoids complex and strenuous construction operations required for checking optimizer-related wiring. For example, in a scenario in which a photovoltaic power system is installed on a roof, a photovoltaic module is usually installed close to the roof and an optimizer is usually installed between a PV panel and the roof, and so, because of this, the photovoltaic module needs to be disassembled for wiring check. In this case, it is difficult to perform construction.

In the prior art, the following method is used to determine whether an installed optimizer can normally work: After a single optimizer is connected to a photovoltaic module and is powered on, an output voltage is controlled to be 1 V, and whether the optimizer normally works can be determined by testing whether the output voltage of the optimizer is 1 V. After installation of photovoltaic modules in series and optimizers in series is completed, the optimizers are powered on, and an output voltage of each of the optimizers is controlled to be 1 V. A quantity of connected optimizers is determined by testing an output voltage of the optimizers in series. For example, if the measured output voltage of the optimizers in series is 20 V, it can be determined that 20 optimizers normally work. However, the output voltage of the optimizer is relatively low (1 V), and it is quite difficult to ensure actual control precision. After output ends of a plurality of optimizers are connected in series, due to accumulation of voltage deviations and a wire voltage drop, there is a specific deviation from an actually tested output voltage of the optimizers. As a result, an estimated quantity of normal optimizers may be different from that of actually connected optimizers.

SUMMARY

Embodiments described herein provide a power conversion apparatus and a method for controlling an output impedance of a power conversion apparatus, to resolve a prior-art problem of relatively low accuracy of a method for determining a working status of a power conversion apparatus.

According to a first aspect, a power conversion apparatus may be provided. The power conversion apparatus includes a power conversion circuit, an impedance adjustable circuit, and a control circuit. The control circuit is connected to both the power conversion circuit and the impedance adjustable circuit, an input end of the power conversion circuit is configured to connect to a power source, and an output end of the power conversion circuit is connected to the impedance adjustable circuit. The power conversion circuit is configured to adjust output power of the power conversion circuit under the control of the control circuit. The impedance adjustable circuit is configured to adjust an output impedance of the impedance adjustable circuit under the control of the control circuit. The control circuit is configured to: when the power conversion apparatus does not satisfy a start condition, control the impedance adjustable circuit to adjust the impedance of the impedance adjustable circuit to a first impedance, or when the power conversion apparatus satisfies a start condition, control the impedance adjustable circuit to adjust the impedance of the impedance adjustable circuit to a second impedance, where the first impedance is not equal to the second impedance.

According to the solution, the output impedance of the impedance adjustable circuit is the first impedance when the power conversion apparatus does not satisfy the start condition, or the output impedance of the impedance adjustable circuit is the second impedance when the power conversion apparatus satisfies the start condition, so that an output impedance of the power conversion apparatus when the power conversion apparatus does not satisfy the start condition is different from an output impedance of the power conversion apparatus when the power conversion apparatus satisfies the start condition. In this way, a working status of the power conversion apparatus can be represented by the output impedance of the power conversion apparatus, and the determined working status of the power conversion apparatus is more accurate than a working status of the power conversion apparatus determined in a voltage detection manner in the prior art.

In a possible implementation, the power conversion apparatus is an optimizer.

In a possible implementation, the impedance adjustable circuit is connected in series to the power conversion circuit, the impedance adjustable circuit includes a first switch and a first load circuit, the first switch is connected in parallel to the first load circuit, and the first switch is further connected to the control circuit. When the power conversion apparatus does not satisfy the start condition, the control circuit controls the first switch to be in a first state; or when the power conversion apparatus satisfies the start condition, the control circuit controls the first switch to be in a second state, where the second state is a state different from the first state.

Further, it may be contemplated that the first state may be an off state, and the second state may be an on state or switching between an off state and an on state according to a specified law; alternatively, the first state may be an on state, and the second state may be an off state or switching between an off state and an on state according to a specified law.

For example, when the power conversion apparatus does not satisfy the start condition, the first switch may be in an on state, and in this case, the first impedance is zero; or when the power conversion apparatus satisfies the start condition, the first switch may be in an off state, and the second impedance is an impedance of the first load circuit. In such a scenario, when the output impedance of the power conversion apparatus is an output impedance of the power conversion circuit, it can be represented that the status of the power conversion apparatus is that the power conversion apparatus does not satisfy the start condition, or that the power conversion apparatus satisfies the start condition but the power conversion apparatus is faulty. When the output impedance of the power conversion apparatus is an impedance obtained after an output impedance of the power conversion circuit and the impedance of the first load circuit are connected in series, it can be represented that the status of the power conversion apparatus is that the power conversion apparatus satisfies the start condition and the power conversion apparatus is normal.

Alternatively, when the power conversion apparatus does not satisfy the start condition, the first switch may be in an off state, and in this case, the first impedance is an impedance of the first load circuit; or when the power conversion apparatus satisfies the start condition, the first switch may be in an on state, and the second impedance is zero. In such a scenario, when the output impedance of the power conversion apparatus is an impedance obtained after an output impedance of the power conversion circuit and the impedance of the first load circuit are connected in series, it can be represented that the status of the power conversion apparatus is that the power conversion apparatus does not satisfy the start condition, or that the power conversion apparatus satisfies the start condition but the power conversion apparatus is faulty. When the output impedance of the power conversion apparatus is an output impedance of the power conversion circuit, it can be represented that the status of the power conversion apparatus is that the power conversion apparatus satisfies the start condition and the power conversion apparatus is normal.

In a possible implementation, when the power conversion apparatus satisfies the start condition, after the control circuit controls the first switch to be in the second state, the control circuit is further configured to: receive first instruction information, and control, according to the first instruction information, the first switch to be in a third state, where the third state is a state different from the second state, so that an output impedance of the power conversion apparatus when the power conversion apparatus normally works is different from the output impedance of the power conversion apparatus when the power conversion apparatus satisfies the start condition; or when the power conversion apparatus satisfies the start condition, after the control circuit controls the first switch to be in the second state, the control circuit is further configured to: determine whether a voltage, a current, or power of an output end of the power conversion apparatus changes; and when determining that the voltage, the current, or the power of the output end of the power conversion apparatus changes, control the first switch to be in a third state, where the third state is a state different from the second state, so that an output impedance of the power conversion apparatus when the power conversion apparatus normally works is different from the output impedance of the power conversion apparatus when the power conversion apparatus satisfies the start condition.

In a possible implementation, the impedance adjustable circuit is connected in parallel to the power conversion circuit, the impedance adjustable circuit includes a second switch and a second load circuit, the second switch is connected in series to the second load circuit, and the second switch is further connected to the control circuit. When the power conversion apparatus does not satisfy the start condition, the control circuit controls the second switch to be in a first state; or when the power conversion apparatus satisfies the start condition, the control circuit controls the second switch to be in a second state, where the second state is a state different from the first state.

Further, the first state may be an off state, and the second state may be an on state or switching between an off state and an on state according to a first law; or the first state may be an on state, and the second state may be an off state or switching between an off state and an on state according to a specified law.

For example, when the power conversion apparatus does not satisfy the start condition, the second switch may be in an on state, and the first impedance may be an output impedance of the second load circuit; or when the power conversion apparatus satisfies the start condition, the second switch may be in an off state, and the second impedance may be infinitely large. In such a scenario, when the output impedance of the power conversion apparatus is an impedance obtained after an output impedance of the power conversion circuit and the output impedance of the second load circuit are connected in parallel, it can be represented that the status of the power conversion apparatus is that the power conversion apparatus does not satisfy the start condition, or that the power conversion apparatus satisfies the start condition but the power conversion apparatus is faulty. When the output impedance of the power conversion apparatus is an output impedance of the power conversion circuit, it can be represented that the status of the power conversion apparatus is that the power conversion apparatus satisfies the start condition and the power conversion apparatus is normal.

Alternatively, when the power conversion apparatus does not satisfy the start condition, the second switch may be in an off state, and the first impedance may be infinitely large; or when the power conversion apparatus satisfies the start condition, the second switch may be in an on state, and the second impedance may be an output impedance of the second load circuit. In such a scenario, when the output impedance of the power conversion apparatus is an output impedance of the power conversion circuit, it can be represented that the status of the power conversion apparatus is that the power conversion apparatus does not satisfy the start condition, or that the power conversion apparatus satisfies the start condition but the power conversion apparatus is faulty. When the output impedance of the power conversion apparatus is an impedance obtained after an output impedance of the power conversion circuit and the output impedance of the second load circuit are connected in parallel, it can be represented that the status of the power conversion apparatus is that the power conversion apparatus satisfies the start condition and the power conversion apparatus is normal.

In a possible implementation, when the power conversion apparatus satisfies the start condition, after the control circuit controls the second switch to be in the second state, the control circuit is further configured to: receive first instruction information, and control, according to the first instruction information, the second switch to be in a third state, where the third state is a state different from the second state; or when the power conversion apparatus satisfies the start condition, after the control circuit controls the second switch to be in the second state, the control circuit is further configured to: determine whether a voltage, a current, or power of an output end of the power conversion apparatus changes; and when determining that the voltage, the current, or the power of the output end of the power conversion apparatus changes, control the second switch to be in a third state, where the third state is a state different from the second state.

In a possible implementation, the impedance adjustable circuit includes a first impedance adjustable circuit and a second impedance adjustable circuit, a first end of the first impedance adjustable circuit is connected in series to a first output end of the power conversion circuit, and the second impedance adjustable circuit is connected in parallel between a second end of the first impedance adjustable circuit and a second output end of the power conversion circuit, or the second impedance adjustable circuit is connected in parallel to the power conversion circuit, and the first impedance adjustable circuit is connected in series to the second impedance adjustable circuit, where the first impedance adjustable circuit includes a first switch and a first load circuit, the first switch is connected in parallel to the first load circuit, the second impedance adjustable circuit includes a second switch and a second load circuit, the second switch is connected in series to the second load circuit, and the first switch and the second switch are further connected to the control circuit. When the power conversion apparatus does not satisfy the start condition, the control circuit controls the first switch to be in a first state, and controls the second switch to be in a first state or a second state, where the second state is a state different from the first state; or when the power conversion apparatus satisfies the start condition, the control circuit controls at least one of the first switch and the second switch to be in a state that is different from a state corresponding to the at least one switch when the power conversion apparatus does not satisfy the start condition.

Further, the first state is an off state, the second state is an on state, a state different from the first state is an on state or switching between an off state and an on state according to a first law, and a state different from the second state is an off state or switching between an off state and an on state according to a second law; or the first state is an off state, the second state is an off state, a state different from the first state is an on state or switching between an off state and an on state according to a first law, and a state different from the second state is an on state or switching between an off state and an on state according to a second law; or the first state is an on state, the second state is an off state, a state different from the first state is an off state or switching between an off state and an on state according to a first law, and a state different from the second state is an on state or switching between an off state and an on state according to a second law; or the first state is an on state, the second state is an on state, a state different from the first state is an off state or switching between an off state and an on state according to a first law, and a state different from the second state is an off state or switching between an off state and an on state according to a second law, where the first law may be the same as or different from the second law.

In a possible implementation, when the power conversion apparatus satisfies the start condition, after the control circuit controls the at least one of the first switch and the second switch to be in the state that is different from the state corresponding to the at least one switch when the power conversion apparatus does not satisfy the start condition, the control circuit is further configured to: receive first instruction information, and control, according to the first instruction information, at least one of the first switch and the second switch to be in a state that is different from a state corresponding to the at least one switch when the power conversion apparatus satisfies the start condition; or when the power conversion apparatus satisfies the start condition, after the control circuit controls the at least one of the first switch and the second switch to be in the state that is different from the state corresponding to the at least one switch when the power conversion apparatus does not satisfy the start condition, the control circuit is further configured to: determine whether a voltage, a current, or power of an output end of the power conversion apparatus has changed; and when determining that the voltage, the current, or the power of the output end of the power conversion apparatus has changed, control at least one of the first switch and the second switch to be in a state that is different from a state corresponding to the at least one switch when the power conversion apparatus satisfies the start condition.

In a possible implementation, when the power conversion apparatus satisfies the start condition, before the control circuit controls the impedance adjustable circuit to adjust the impedance of the impedance adjustable circuit to the second impedance, the control circuit is further configured to determine that the power conversion apparatus can normally work.

According to a second aspect, this application further provides a method for controlling an output impedance of a power conversion apparatus. The method includes: adjusting the output impedance of the power conversion apparatus to a first impedance when the power conversion apparatus does not satisfy a start condition; or adjusting the output impedance of the power conversion apparatus to a second impedance when the power conversion apparatus satisfies a start condition, where the first impedance is not equal to the second impedance.

According to the method, the output impedance of the power conversion apparatus is adjusted to the first impedance when the power conversion apparatus does not satisfy the start condition, or the output impedance of the power conversion apparatus is adjusted to the second impedance when the power conversion apparatus satisfies the start condition, so that the output impedance of the power conversion apparatus when the power conversion apparatus does not satisfy the start condition is different from the output impedance of the power conversion apparatus when the power conversion apparatus satisfies the start condition. In this way, a working status of the power conversion apparatus can be represented by the output impedance of the power conversion apparatus, and the determined working status of the power conversion apparatus is more accurate than a working status of the power conversion apparatus determined in a voltage detection manner in the prior art. For example, when the output impedance of the power conversion apparatus is the first impedance, it can be represented that the status of the power conversion apparatus is that the power conversion apparatus does not satisfy the start condition, or that the power conversion apparatus satisfies the start condition but the power conversion apparatus is faulty. When the output impedance of the power conversion apparatus is the second impedance, it can be represented that the status of the power conversion apparatus is that the power conversion apparatus satisfies the start condition and the power conversion apparatus is normal.

In a possible implementation, the power conversion apparatus includes a power conversion circuit, an impedance adjustable circuit, and a control circuit. The control circuit is connected to both the power conversion circuit and the impedance adjustable circuit, and an output end of the power conversion circuit is connected to the impedance adjustable circuit. Adjusting the output impedance of the power conversion apparatus to a first impedance when the power conversion apparatus does not satisfy a start condition includes: adjusting an impedance of the impedance adjustable circuit to a third impedance when the power conversion apparatus does not satisfy the start condition, where the third impedance is determined based on an equivalent impedance of the power conversion circuit when the power conversion circuit does not satisfy the start condition and the first impedance. Adjusting the output impedance of the power conversion apparatus to a second impedance when the power conversion apparatus satisfies a start condition includes: adjusting an impedance of the impedance adjustable circuit to a fourth impedance when the power conversion apparatus satisfies the start condition, where the fourth impedance is determined based on an equivalent impedance of the power conversion circuit when the power conversion circuit satisfies the start condition and the second impedance.

In a possible implementation, the power conversion apparatus includes a buck circuit. The adjusting the output impedance of the power conversion apparatus to a first impedance when the power conversion apparatus does not satisfy a start condition includes: controlling, when the power conversion apparatus does not satisfy the start condition, a status of a first-type switch to change according to a first law, where the first-type switch is a switch that can change an output impedance of the buck circuit and that is in the buck circuit, and the first law is determined based on the first impedance. The adjusting the output impedance of the power conversion apparatus to a second impedance when the power conversion apparatus satisfies a start condition includes: controlling, when the power conversion apparatus satisfies the start condition, a status of a first-type switch to change according to a second law, where the second law is determined based on the second impedance.

Further, when satisfying the start condition, the power conversion apparatus further controls a second-type switch to be in an off state, where the second-type switch is a switch, in the buck circuit, configured to directly connect to a power source.

In a possible implementation, the buck circuit includes a first capacitor, a first switch, a second switch, an inductor, and a second capacitor. A first end of the first capacitor is connected to a first end of the first switch, a second end of the first switch is connected to both a first end of the inductor and a first end of the second switch, a third end of the first switch is configured to input a signal for controlling a status of the first switch, a second end of the second switch is connected to both a second end of the first capacitor and a first end of the second capacitor, a third end of the second switch is configured to input a signal for controlling a status of the second switch, and a second end of the inductor is connected to a second end of the second capacitor. In this case, the first-type switch is the second switch, and the second-type switch is the first switch.

The first law may be that the second switch is normally open, and the second law is that the second switch is normally closed (kept in an on state); or the first law may be that the second switch is normally open (kept in an off state), and the second law is that the second switch is switched between an on state and an off state according to a specified rule; or the first law may be that the second switch is normally closed, and the second law is that the second switch is normally open; or the first law may be that the second switch is normally closed, and the second law is that the second switch is switched between an on state and an off state according to a specified rule. For example, when the second law is that the second switch is switched between an on state and an off state according to the specified rule, the specified rule includes a frequency at which the second switch is switched between an on state and an off state and a duration during which the second switch is in an on state (or an off state). The specified rule is determined based on the second impedance.

In a possible implementation, the power conversion apparatus includes a boost circuit. Adjusting the output impedance of the power conversion apparatus to a first impedance when the power conversion apparatus does not satisfy a start condition includes: controlling, when the power conversion apparatus does not satisfy the start condition, a status of a first-type switch to change according to a first law, where the first-type switch is a switch that can change an output impedance of the boost circuit and that is in the boost circuit, and the first law is determined based on the first impedance. Adjusting the output impedance of the power conversion apparatus to a second impedance when the power conversion apparatus satisfies a start condition includes: controlling, when the power conversion apparatus satisfies the start condition, a status of a first-type switch to change according to a second law, where the second change law is determined based on the second impedance.

Further, when satisfying the start condition, the power conversion apparatus further controls a second-type switch to be in an off state, where the second-type switch is a switch, in the boost circuit, that is directly connected to a power source.

In a possible implementation, the boost circuit includes a first capacitor, a first switch, an inductor, a second switch, a third switch, and a second capacitor. A first end of the first capacitor is connected to a first end of the first switch, a second end of the first switch is connected to a first end of the inductor, a second end of the inductor is connected to both a first end of the second switch and a first end of the third switch, a second end of the first capacitor is connected to both a second end of the second switch and a first end of the second capacitor, a second end of the third switch is connected to a second end of the second capacitor, a third end of the first switch is configured to input a signal for controlling a status of the first switch, a third end of the second switch is configured to input a signal for controlling a status of the second switch, and a third end of the third switch is configured to input a signal for controlling a status of the third switch. In this case, the first-type switch is the second switch and the third switch, and the second-type switch is the first switch.

The first law may be that the second switch is normally closed, and the third switch is normally open; or the first law is that the second switch is normally open, and the third switch is normally open; or the first law may be that the second switch is normally open, and the third switch is normally closed; or the first law may be that the second switch is normally closed, and the third switch is normally closed.

The second law may be that the status of the second switch changes according to any one of the following laws: normally closed, normally open, and switched between an on state and an off state according to a first rule, and that the status of the third switch changes according to any one of the following laws: switched between an on state and an off state according to a second rule, or normally closed. In addition, at least one of the change law corresponding to the second switch in the second law and the change law corresponding to the third switch in the second law is different from a corresponding change law in the first law. The first rule includes a frequency at which the second switch is switched between an on state and an off state and a duration during which the second switch is in an on state (or an off state), and the second rule includes a frequency at which the third switch is switched between an on state and an off state and a duration during which the third switch is in an on state (or an off state). The first rule and the second rule are determined based on the second impedance.

In a possible implementation, the power conversion apparatus includes a buck-boost circuit. The adjusting the output impedance of the power conversion apparatus to a first impedance when the power conversion apparatus does not satisfy a start condition includes: controlling, when the power conversion apparatus does not satisfy the start condition, a status of a first-type switch to change according to a first law, where the first-type switch is a switch that can change the output impedance of the power conversion apparatus and that is in the buck-boost circuit, and the first law is determined based on the first impedance. The adjusting the output impedance of the power conversion apparatus to a second impedance when the power conversion apparatus satisfies a start condition includes: controlling, when the power conversion apparatus satisfies the start condition, a status of a first-type switch to change according to a second law, where the second change law is determined based on the second impedance.

Further, when satisfying the start condition, the power conversion apparatus further controls a second-type switch to be in an off state, where the second-type switch is a switch, in the buck-boost circuit, that is directly connected to a power source.

In a possible implementation, the buck-boost circuit includes a first capacitor, a first switch, a second switch, a third switch, a fourth switch, and a second capacitor. A first end of the first capacitor is connected to a first end of the first switch, a second end of the first capacitor is connected to all of a first end of the second switch, a first end of the third switch, and a first end of the second capacitor, a second end of the first switch is connected to both a first end of an inductor and a second end of the second switch, a second end of the inductor is connected to both a second end of the third switch and a first end of the fourth switch, a second end of the fourth switch is connected to a second end of the second capacitor, a third end of the first switch is configured to input a signal for controlling a status of the first switch, a third end of the second switch is configured to input a signal for controlling a status of the second switch, a third end of the third switch is configured to input a signal for controlling a status of the third switch, and a third end of the fourth switch is configured to input a signal for controlling a status of the fourth switch. In this case, the first-type switch is the third switch and the fourth switch, the first-type switch is the second switch and the fourth switch, or the first-type switch is the second switch, the third switch, and the fourth switch; and the second-type switch is the first switch.

When the first-type switch is the second switch and the fourth switch, the first law may be that the second switch is normally closed, and the fourth switch is normally open; or the first law may be that the second switch is normally open, and the fourth switch is normally open; or the first law may be that the second switch is normally closed, and the fourth switch is normally closed; or the first law may be that the second switch is normally open, and the fourth switch is normally closed.

The second law is that the status of the second switch changes according to any one of the following laws: normally closed, normally open, and switched between an on state and an off state according to a first rule, and that the status of the fourth switch changes according to any one of the following laws: switched between an on state and an off state according to a second rule, or normally closed. In addition, at least one of the change law corresponding to the second switch in the second law and the change law corresponding to the fourth switch in the second law is different from a corresponding change law in the first law. The first rule includes a frequency at which the second switch is switched between an on state and an off state and a duration during which the second switch is in an on state (or an off state), and the second rule includes a frequency at which the fourth switch is switched between an on state and an off state and a duration during which the fourth switch is in an on state (or an off state). The first rule and the second rule are determined based on the second impedance.

When the first-type switch is the third switch and the fourth switch, the first law may be that the third switch is normally closed, and the fourth switch is normally open; or the first law may be that the third switch is normally open, and the fourth switch is normally open; or the first law may be that the third switch is normally closed, and the fourth switch is normally closed; or the first law may be that the third switch is normally open, and the fourth switch is normally closed.

The second law is that the status of the third switch changes according to any one of the following laws: normally closed, normally open, and switched between an on state and an off state according to a first rule, and that the status of the fourth switch changes according to any one of the following laws: switched between an on state and an off state according to a second rule, or normally closed. In addition, at least one of the change law corresponding to the third switch in the second law and the change law corresponding to the fourth switch in the second law is different from a corresponding change law in the first law. The first rule includes a frequency at which the third switch is switched between an on state and an off state and a duration during which the third switch is in an on state (or an off state), and the second rule includes a frequency at which the fourth switch is switched between an on state and an off state and a duration during which the fourth switch is in an on state (or an off state). The first rule and the second rule are determined based on the second impedance.

When the first-type switch is the second switch, the third switch, and the fourth switch, the first law may be that the second switch is normally open, the third switch is normally open, and the fourth switch is normally open; or the first law may be that the second switch is normally open, the third switch is normally open, and the fourth switch is normally closed; or the first law may be that the second switch is normally open, the third switch is normally closed, and the fourth switch is normally open; or the first law may be that the second switch is normally open, the third switch is normally closed, and the fourth switch is normally closed; or the first law is that the second switch is normally closed, the third switch is normally open, and the fourth switch is normally open; or the first law is that the second switch is normally closed, the third switch is normally open, and the fourth switch is normally closed; or the first law may be that the second switch is normally closed, the third switch is normally closed, and the fourth switch is normally open; or the first law is that the second switch is normally closed, the third switch is normally closed, and the fourth switch is normally closed.

The second law is that the status of the second switch changes according to any one of the following laws: normally closed, normally open, and switched between an on state and an off state according to a first rule, that the status of the third switch changes according to any one of the following laws: normally closed, normally open, and switched between an on state and an off state according to a second rule, and that the status of the fourth switch changes according to any one of the following laws: switched between an on state and an off state according to a third rule, or normally closed. In addition, at least one of the change law corresponding to the second switch in the second law, the change law corresponding to the third switch in the second law, and the change law corresponding to the fourth switch in the second law is different from a corresponding change law in the first law. The first rule includes a frequency at which the second switch is switched between an on state and an off state and a duration during which the second switch is in an on state (or an off state), the second rule includes a frequency at which the third switch is switched between an on state and an off state and a duration during which the third switch is in an on state (or an off state), and the third rule includes a frequency at which the fourth switch is switched between an on state and an off state and a duration during which the fourth switch is in an on state (or an off state). The first rule, the second rule, and the third rule are determined based on the second impedance.

According to a third aspect, this application further provides a photovoltaic power system. The system includes a photovoltaic module, an optimizer, and an inverter. The photovoltaic module is configured to: convert solar energy into electrical energy, and output the electrical energy to the optimizer. The optimizer is configured to: adjust an output impedance of the optimizer to a first impedance when the optimizer does not satisfy a start condition, or adjust an output impedance of the optimizer to a second impedance when the optimizer satisfies a start condition, where the first impedance is not equal to the second impedance; and when the optimizer satisfies the start condition and the optimizer needs to control output power, adjust output power of the photovoltaic module and output adjusted power. The inverter is configured to: convert the power output by the optimizer into electrical energy satisfying a specified condition, and output the converted electrical energy to a power grid or a load.

In a possible implementation, the optimizer includes a power conversion circuit, an impedance adjustable circuit, and a control circuit. The control circuit is connected to both the power conversion circuit and the impedance adjustable circuit, and an output end of the power conversion circuit is connected to the impedance adjustable circuit. The optimizer is specifically configured to: adjust an impedance of the impedance adjustable circuit to a third impedance when the optimizer does not satisfy the start condition, where the third impedance is determined based on an equivalent impedance of the power conversion circuit when the power conversion circuit does not satisfy the start condition and the first impedance; or adjust an impedance of the impedance adjustable circuit to a fourth impedance when the optimizer satisfies the start condition, where the fourth impedance is determined based on an equivalent impedance of the power conversion circuit when the power conversion circuit satisfies the start condition and the second impedance.

In a possible implementation, the optimizer includes a boost circuit. In this case, the optimizer is specifically configured to: control, when the optimizer does not satisfy the start condition, a status of a first-type switch to change according to a first law, where the first-type switch is a switch that can change an output impedance of the boost circuit and that is in the boost circuit, and the first law is determined based on the first impedance; or control, when the optimizer satisfies the start condition, a status of a first-type switch to change according to a second law, where the second change law is determined based on the second impedance.

Further, when satisfying the start condition, the optimizer is further configured to control a second-type switch to be in an off state, where the second-type switch is a switch, in the boost circuit, that is directly connected to a power source.

In a possible implementation, the optimizer includes a buck circuit. In this case, the optimizer is specifically configured to: control, when the optimizer does not satisfy the start condition, a status of a first-type switch to change according to a first law, where the first-type switch is a switch that can change an output impedance of the buck circuit and that is in the buck circuit, and the first law is determined based on the first impedance; or control, when the optimizer satisfies the start condition, a status of a first-type switch to change according to a second law, where the first-type switch is a switch that can change an output impedance of the buck circuit and that is in the buck circuit, and the second law is determined based on the second impedance.

Further, when satisfying the start condition, the optimizer is further configured to control a second-type switch to be in an off state, where the second-type switch is a switch, in the buck circuit, configured to directly connect to a power source.

In a possible implementation, the optimizer includes a buck-boost circuit. In this case, the optimizer is specifically configured to: control, when the optimizer does not satisfy the start condition, a status of a first-type switch to change according to a first law, where the first-type switch is a switch that can change an output impedance of a power conversion apparatus and that is in the buck-boost circuit, and the first law is determined based on the first impedance; or control, when the optimizer satisfies the start condition, a status of a first-type switch to change according to a second law, where the second change law is determined based on the second impedance.

Further, when satisfying the start condition, the optimizer is further configured to control a second-type switch to be in an off state, where the second-type switch is a switch, in the buck-boost circuit, that is directly connected to a power source.

DESCRIPTION OF EMBODIMENTS

Figure 1:
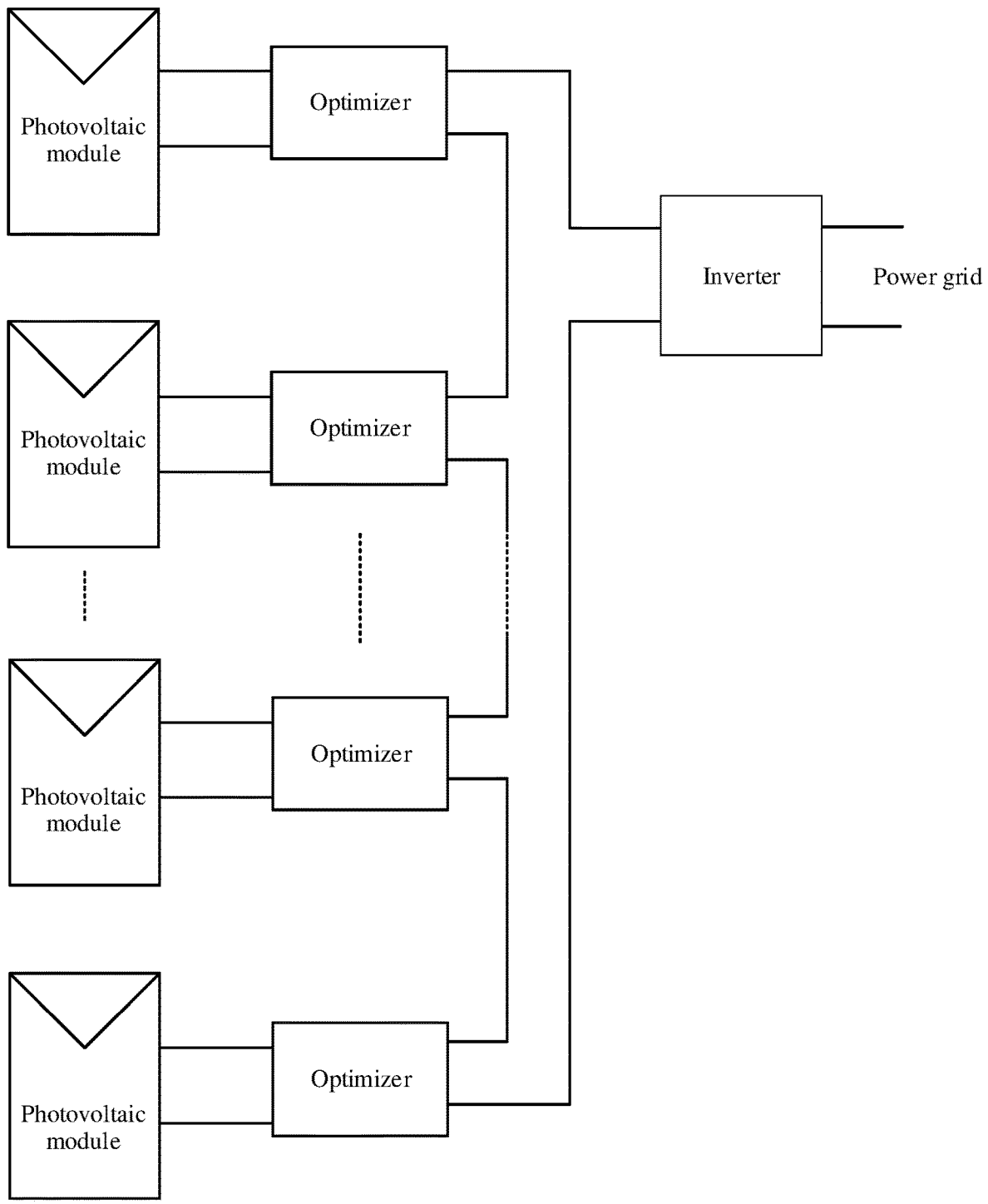
FIG. 1 is a schematic structural diagram of a photovoltaic power system in the prior art.

In a scenario in which a photovoltaic power system includes optimizers, there are many field wiring cases, and the optimizers are usually installed on rear faces of photovoltaic modules (for example, fastened on supports of the photovoltaic modules or frames of the photovoltaic modules). Therefore, in an installation process of the photovoltaic system, whether the optimizers can normally work needs to be determined after the photovoltaic modules and the optimizers are installed. In this way, normal installation can be ensured after installation and construction of the photovoltaic modules and the optimizers are completed, and checking of related wiring required due to an optimizer installation problem does not need to be subsequently performed. This avoids complex and strenuous construction operations required for checking optimizer-related wiring.

In the prior art, after a single optimizer is connected to a photovoltaic module and is powered on, an output voltage is controlled to be 1 V, and whether the optimizer normally works can be determined by testing whether the output voltage of the optimizer is 1 V. However, the output voltage of the optimizer is relatively low (1 V), and it is quite difficult to ensure actual control precision. After output ends of a plurality of optimizers are connected in series, due to accumulation of voltage deviations and a wire voltage drop, there is a specific deviation from an actually tested output voltage of the optimizers. As a result, an estimated quantity of normal optimizers may be different from that of actually connected optimizers.

To resolve the foregoing prior-art problem and improve accuracy of a determined working status of a power conversion apparatus, embodiments of a power conversion apparatus and a method for controlling an output impedance of a power conversion apparatus are provided herein. An output impedance of the power conversion apparatus when no signal is input and an output impedance of the power conversion apparatus when a signal is input but no signal is output are set, to make corresponding output impedances of the power conversion apparatus different when the power conversion apparatus is in different working statuses (for example, the power conversion apparatus is faulty or there is no input to the power conversion apparatus). In this way, the working status of the power conversion apparatus can be represented by the output impedance of the power conversion apparatus.

In addition, it should be understood that in the descriptions provided herein, terms such as "first" and "second" are only used for description differentiation, but cannot be understood as indication or implication of relative importance and cannot be understood as indication or implication of sequences; "and/or describes an association relationship for describing associated objects, and represents that three relationships may exist. For example, A and/or B may represent the following cases: Only A exists, both A and B exist, and only B exists. The character "/" generally indicates an "or" relationship between associated objects; "a plurality of" means two or more.

To make the objectives, technical solutions, and advantages of these embodiments clearer, the following further describes these embodiments in detail with reference to the accompanying drawings.

Figure 2:
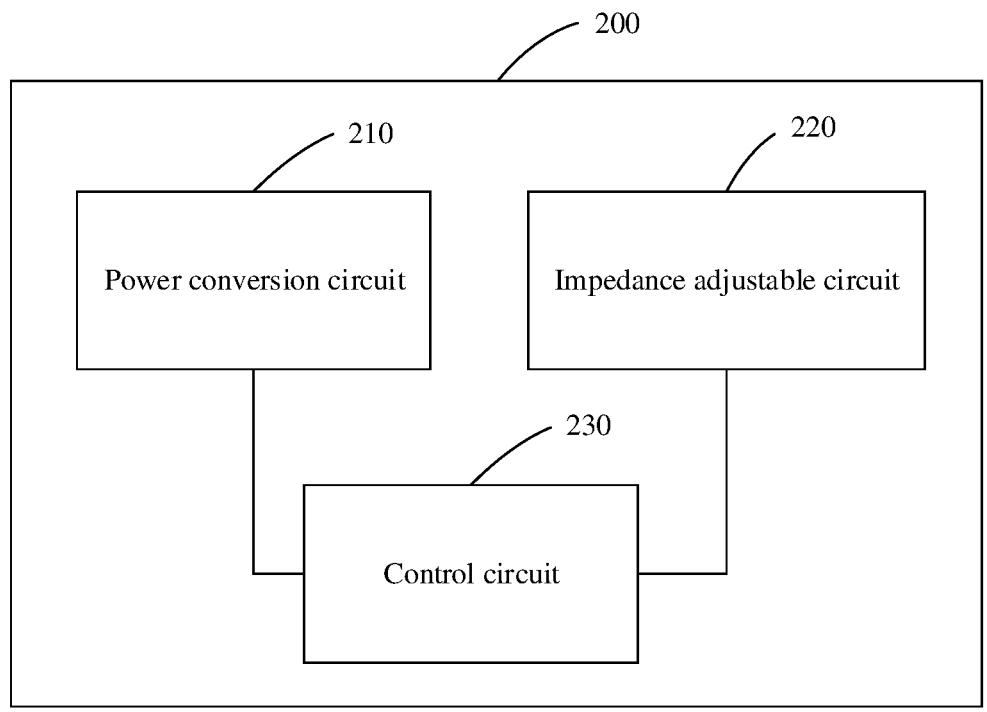
FIG. 2 is a schematic structural diagram 1 of a power conversion apparatus according to an embodiment.

As shown in FIG. 2, an embodiment of a power conversion apparatus 200 may be provided. In the contemplated exemplary embodiment, the power conversion apparatus 200 includes a power conversion circuit 210, an impedance adjustable circuit 220, and a control circuit 230. The control circuit 230 is connected to both the power conversion circuit 210 and the impedance adjustable circuit 220, an input end of the power conversion circuit 210 is configured to connect to a power source, and an output end of the power conversion circuit 210 is connected to the impedance adjustable circuit 220. For example, the power conversion circuit 210 is configured to adjust output power of the power conversion circuit 210 under the control of the control circuit 230. The impedance adjustable circuit 220 is configured to adjust an output impedance of the impedance adjustable circuit 220 under the control of the control circuit 230. The control circuit 230 is configured to: when the power conversion apparatus 200 does not satisfy a start condition, control the impedance adjustable circuit 220 to adjust the impedance of the impedance adjustable circuit 220 to a first impedance, or when the power conversion apparatus 200 satisfies a start condition, control the impedance adjustable circuit 220 to adjust the impedance of the impedance adjustable circuit 220 to a second impedance, where the first impedance is not equal to the second impedance.

Further, the power conversion apparatus 200 may be an optimizer, and the start condition of the power conversion apparatus 200 is that input power of the power conversion apparatus 200 is greater than or equal to minimum power-on operating power of the control circuit 230.

Figure 3:
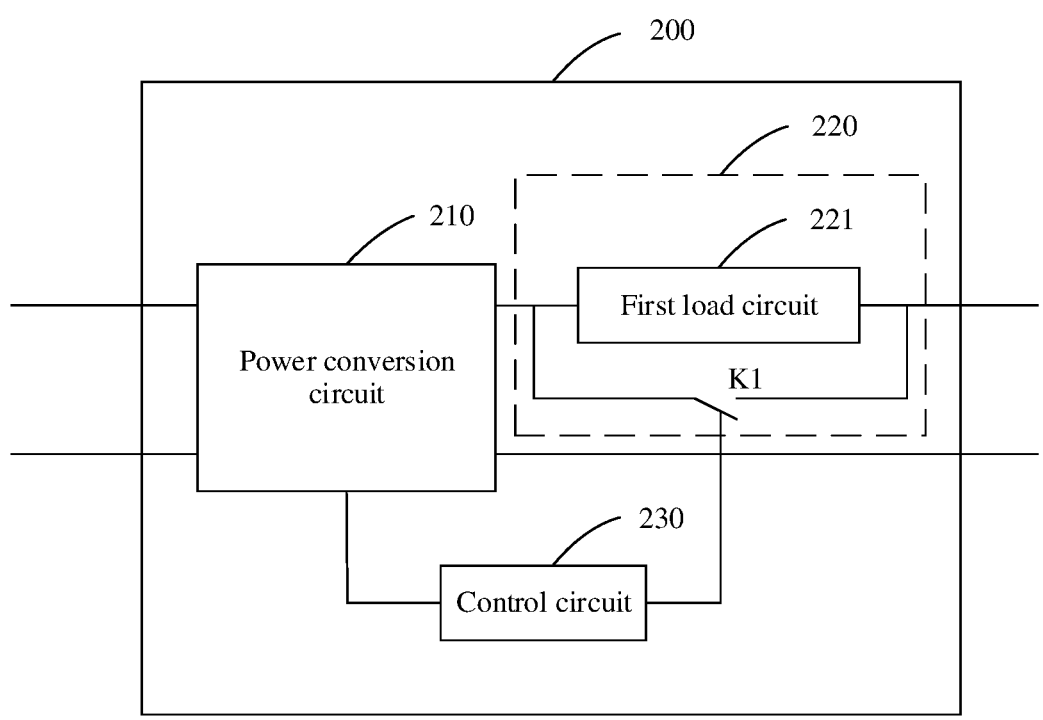
FIG. 3 is a schematic structural diagram 2 of a power conversion apparatus according to an embodiment

During specific implementation, the impedance adjustable circuit may be implemented in a manner shown in FIG. 3. The impedance adjustable circuit 220 is connected in series to the power conversion circuit 210, the impedance adjustable circuit 220 includes a first switch K1 and a first load circuit 221, the first switch K1 is connected in parallel to the first load circuit 221, and the first switch K1 is further connected to the control circuit 230. When the power conversion apparatus 200 does not satisfy the start condition, the control circuit 230 controls the first switch K1 to be in a first state; or when the power conversion apparatus 200 satisfies the start condition, the control circuit 230 controls the first switch K1 to be in a second state, where the second state is a state different from the first state.

The first state may be an off state, and in this case, the second state may be an on state or switching between an off state and an on state according to a specified law; or the first state may be an on state, and in this case, the second state is an off state or switching between an off state and an on state according to a specified law.

For example, when the power conversion apparatus 200 does not satisfy the start condition, the first switch K1 is in an on state, and in this case, the first impedance is zero; or when the power conversion apparatus 200 satisfies the start condition, the first switch K1 is in an off state, and the second impedance is an impedance of the first load circuit 221. In such a scenario, when an output impedance of the power conversion apparatus 200 is an output impedance of the power conversion circuit 210, it can be represented that a status of the power conversion apparatus 200 is that the power conversion apparatus 200 does not satisfy the start condition, or that the power conversion apparatus 200 satisfies the start condition but the power conversion apparatus 200 is faulty. When an output impedance of the power conversion apparatus 200 is an impedance obtained after an output impedance of the power conversion circuit 210 and the impedance of the first load circuit 221 are connected in series, it can be represented that the power conversion apparatus 200 satisfies the start condition and that the power conversion apparatus 200 is normal.

Alternatively, when the power conversion apparatus 200 does not satisfy the start condition, the first switch K1 is in an off state, and in this case, the first impedance is an impedance of the first load circuit 221; or when the power conversion apparatus 200 satisfies the start condition, the first switch K1 is in an on state, and the second impedance is zero. In such a scenario, when an output impedance of the power conversion apparatus 200 is an impedance obtained after an output impedance of the power conversion circuit 210 and the impedance of the first load circuit 221 are connected in series, it can be represented that a status of the power conversion apparatus 200 is that the power conversion apparatus 200 does not satisfy the start condition, or that the power conversion apparatus 200 satisfies the start condition but the power conversion apparatus 200 is faulty. When an output impedance of the power conversion apparatus 200 is an output impedance of the power conversion circuit 210, it can be represented that a status of the power conversion apparatus 200 is that the power conversion apparatus 200 satisfies the start condition and that the power conversion apparatus 200 is normal.

Further, when the power conversion apparatus 200 satisfies the start condition, after the control circuit 230 controls the first switch K1 to be in the second state, the apparatus 200 is further configured to: receive first instruction information, and control, according to the first instruction information, the first switch K1 to be in a third state, where the third state is a state different from the second state, so that an output impedance of the power conversion apparatus 200 when the power conversion apparatus 200 normally works is different from an output impedance of the power conversion apparatus 200 when the power conversion apparatus 200 satisfies the start condition. For example, when the second state is an on state, the third state is an off state; or when the second state is an off state, the third state is an on state. Alternatively, when the second state is that the first switch K1 is switched between an off state and an on state according to a specified law, the third state is also that the first switch K1 is switched between an off state and an on state according to the specified law, but at least one of a frequency at which the first switch K1 is switched between an off state and an on state and a duration during which the first switch K1 is in an off state (or an on state) in the second state is different from a corresponding frequency and/or a corresponding duration in the third state.

In a specific implementation, when the power conversion apparatus 200 satisfies the start condition, after the control circuit 230 controls the first switch K1 to be in the second state, the apparatus 200 is further configured to: receive first instruction information, where the first instruction information is used to instruct the controller 230 to control work of the power conversion circuit 210; and according to the first instruction information, control the first switch K1 to be in an on state, control the power conversion circuit 210 to adjust power input to the power conversion circuit 210, and output adjusted power, so that when the power conversion circuit 210 works, the first load circuit 221 is short-circuited, and therefore the first load circuit 221 does not affect normal work of the power conversion apparatus 200.

Alternatively, when the power conversion apparatus 200 satisfies the start condition, after the control circuit 230 controls the first switch K1 to be in the second state, the apparatus 200 is further configured to: detect whether a voltage, a current, or power of an output end of the power conversion apparatus 200 changes; and when determining that the voltage, the current, or the power of the output end of the power conversion apparatus 200 changes, control the first switch K1 to be in a third state, where the third state is a state different from the second state, so that an output impedance of the power conversion apparatus 200 when the power conversion apparatus 200 normally works is different from an output impedance of the power conversion apparatus 200 when the power conversion apparatus 200 satisfies the start condition. For example, when the second state is an on state, the third state is an off state; or when the second state is an off state, the third state is an on state. Alternatively, when the second state is that the first switch K1 is switched between an off state and an on state according to a specified law, the third state is also that the first switch K1 is switched between an off state and an on state according to the specified law, but at least one of a frequency at which the first switch K1 is switched between an off state and an on state and a duration during which the first switch K1 is in an off state (or an on state) in the second state is different from a corresponding frequency and/or a corresponding duration in the third state.

In a specific implementation, when the power conversion apparatus 200 satisfies the start condition, after the control circuit 230 controls the first switch K1 to be in the second state, the apparatus 200 is further configured to: when determining that the voltage, the current, or the power of the output end of the power conversion apparatus 200 changes, control the first switch K1 to be closed. In this case, the first load circuit 221 is short-circuited, and therefore the first load circuit 221 does not affect normal work of the power conversion apparatus 200.

Figure 4:
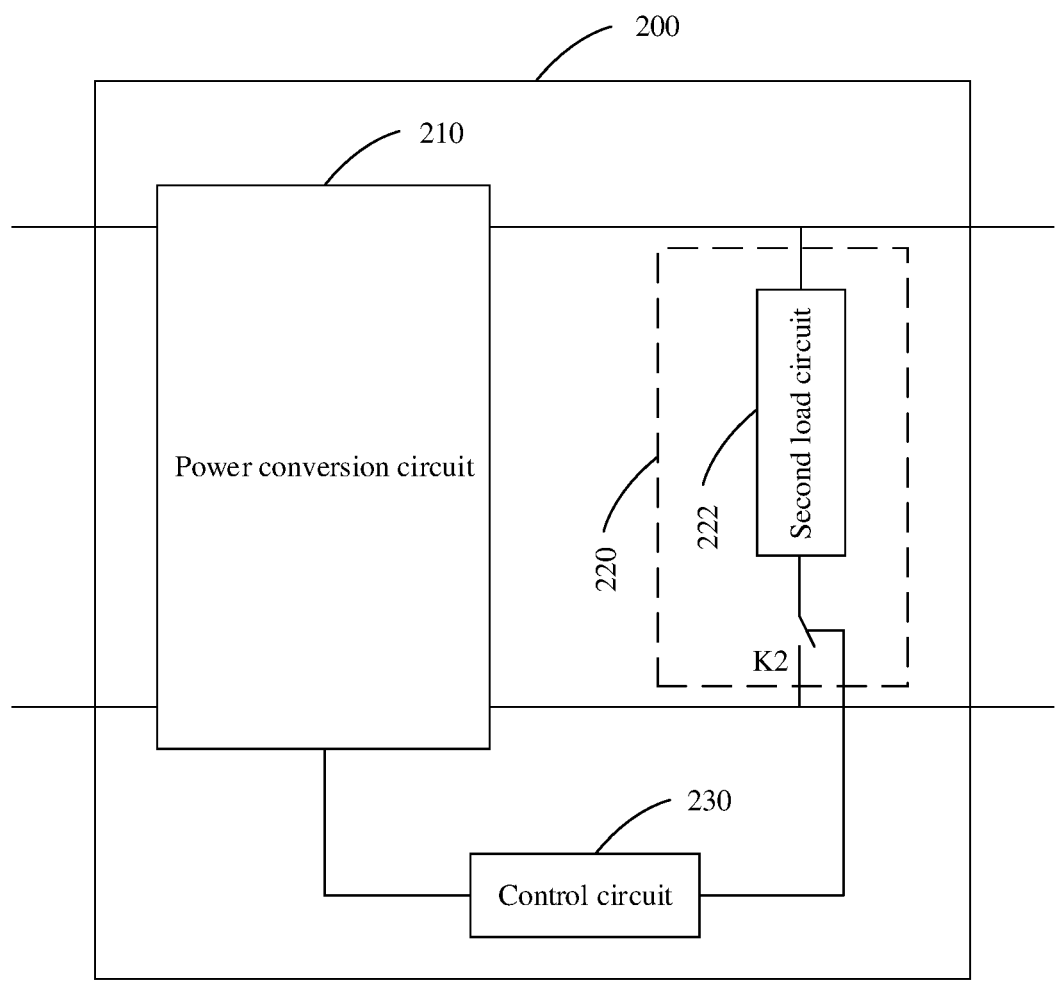
FIG. 4 is a schematic structural diagram 3 of a power conversion apparatus according to an embodiment.

During specific implementation, the impedance adjustable circuit may be implemented in a manner shown in FIG. 4. The impedance adjustable circuit 220 is connected in parallel to the power conversion circuit 210, the impedance adjustable circuit 220 includes a second switch K2 and a second load circuit 222, the second switch K2 is connected in series to the second load circuit 222, and the second switch K2 is further connected to the control circuit 230. When the power conversion apparatus 200 does not satisfy the start condition, the control circuit 230 controls the second switch K2 to be in a first state; or when the power conversion apparatus 200 satisfies the start condition, the control circuit 230 controls the second switch K2 to be in a second state, where the second state is a state different from the first state.

The first state may be an off state, and in this case, the second state may be an on state or switching between an off state and an on state according to a first law; or the first state may be an on state, and in this case, the second state may be an off state or switching between an off state and an on state according to a specified law.

For example, when the power conversion apparatus 200 does not satisfy the start condition, the second switch K2 is in an on state, and the first impedance is an output impedance of the second load circuit 222; or when the power conversion apparatus 200 satisfies the start condition, the second switch K2 is in an off state, and the second impedance is infinitely large. In such a scenario, when an output impedance of the power conversion apparatus 200 is an impedance obtained after an output impedance of the power conversion circuit 210 and the output impedance of the second load circuit 222 are connected in parallel, it can be represented that a status of the power conversion apparatus 200 is that the power conversion apparatus 200 does not satisfy the start condition, or that the power conversion apparatus 200 satisfies the start condition but the power conversion apparatus 200 is faulty. When an output impedance of the power conversion apparatus 200 is an output impedance of the power conversion circuit 210, it can be represented that a status of the power conversion apparatus 200 is that the power conversion apparatus 200 satisfies the start condition and that the power conversion apparatus 200 is normal.

For another example, when the power conversion apparatus 200 does not satisfy the start condition, the second switch K2 is in an off state, and the first impedance is infinitely large; or when the power conversion apparatus 200 satisfies the start condition, the second switch K2 is in an on state, and the second impedance is an output impedance of the second load circuit 222. In such a scenario, when an output impedance of the power conversion apparatus 200 is an output impedance of the power conversion circuit 210, it can be represented that a status of the power conversion apparatus 200 is that the power conversion apparatus 200 does not satisfy the start condition, or that the power conversion apparatus 200 satisfies the start condition but the power conversion apparatus 200 is faulty. When an output impedance of the power conversion apparatus 200 is an impedance obtained after an output impedance of the power conversion circuit 210 and the output impedance of the second load circuit 222 are connected in parallel, it can be represented that a status of the power conversion apparatus 200 is that the power conversion apparatus 200 satisfies the start condition and that the power conversion apparatus 200 is normal.

Further, when the power conversion apparatus 200 satisfies the start condition, after the control circuit 230 controls the second switch to be in the second state, the apparatus 200 is further configured to: receive first instruction information, and control, according to the first instruction information, the second switch K2 to be in a third state, where the third state is a state different from the second state, so that an output impedance of the power conversion apparatus 200 when the power conversion apparatus 200 normally works is different from an output impedance of the power conversion apparatus 200 when the power conversion apparatus 200 satisfies the start condition. For example, when the second state is an on state, the third state is an off state; or when the second state is an off state, the third state is an on state. Alternatively, when the second state is that the second switch K2 is switched between an off state and an on state according to a specified law, the third state is also that the second switch K2 is switched between an off state and an on state according to the specified law, but at least one of a frequency at which the second switch K2 is switched between an off state and an on state and a duration during which the second switch K2 is in an off state (or an on state) in the second state is different from a corresponding frequency and/or a corresponding duration in the third state.

In a specific implementation, when the power conversion apparatus 200 satisfies the start condition, after the control circuit 230 controls the second switch K2 to be in the second state, the apparatus 200 is further configured to: receive the first instruction information, where the first instruction information is used to instruct the control circuit 230 to control work of the power conversion circuit 210; and according to the first instruction information, control the second switch K2 to be open, control the power conversion circuit 210 to adjust power input to the power conversion circuit 210, and output adjusted power, so that when the power conversion circuit 210 works, the second load circuit 222 is in an open-circuit state, and therefore the second load circuit 222 does not affect normal work of the power conversion apparatus 200.

Alternatively, when the power conversion apparatus 200 satisfies the start condition, after the control circuit 230 controls the second switch K2 to be in the second state, the apparatus 200 is further configured to: detect whether a voltage, a current, or power of an output end of the power conversion apparatus 200 changes; and when determining that the voltage, the current, or the power of the output end of the power conversion apparatus 200 changes, control the second switch K2 to be in a third state, where the third state is a state different from the second state, so that an output impedance of the power conversion apparatus 200 when the power conversion apparatus 200 normally works is different from an output impedance of the power conversion apparatus 200 when the power conversion apparatus 200 satisfies the start condition. For example, when the second state is an on state, the third state is an off state; or when the second state is an off state, the third state is an on state. Alternatively, when the second state is that the second switch K2 is switched between an off state and an on state according to a specified law, the third state is also that the second switch K2 is switched between an off state and an on state according to the specified law, but at least one of a frequency at which the second switch K2 is switched between an off state and an on state and a duration during which the second switch K2 is in an off state (or an on state) in the second state is different from a corresponding frequency and/or a corresponding duration in the third state.

In a specific implementation, when the power conversion apparatus 200 satisfies the start condition, after the control circuit 230 controls the second switch K2 to be in the second state, the apparatus 200 is further configured to: determine whether the voltage, the current, or the power of the output end of the power conversion apparatus 200 changes; and when determining that the voltage, the current, or the power of the output end of the power conversion apparatus 200 changes, control the second switch K2 to be open. In this case, the second load circuit 222 is in an open-circuit state, and therefore the second load circuit 222 does not affect normal work of the power conversion apparatus 200.

Figure 5A:
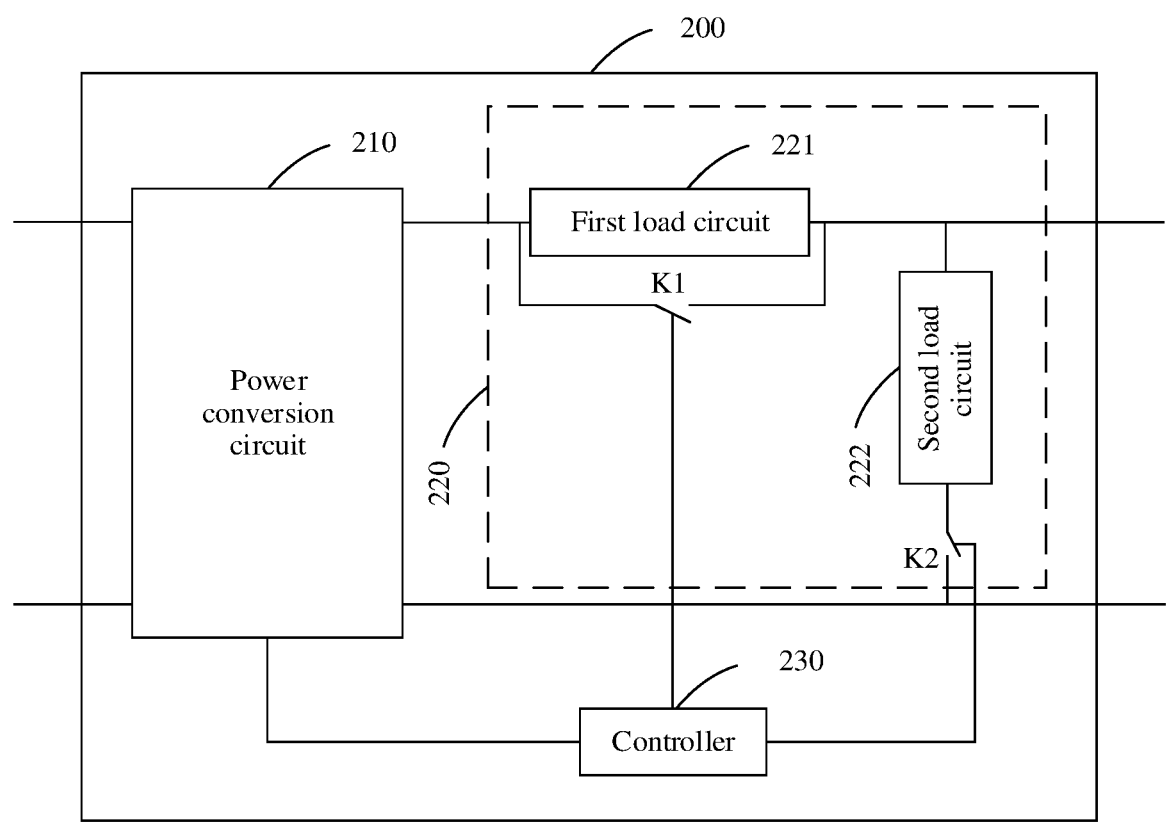
FIG. 5a is a schematic structural diagram 4 of a power conversion apparatus according to an embodiment.
Figure 5B:
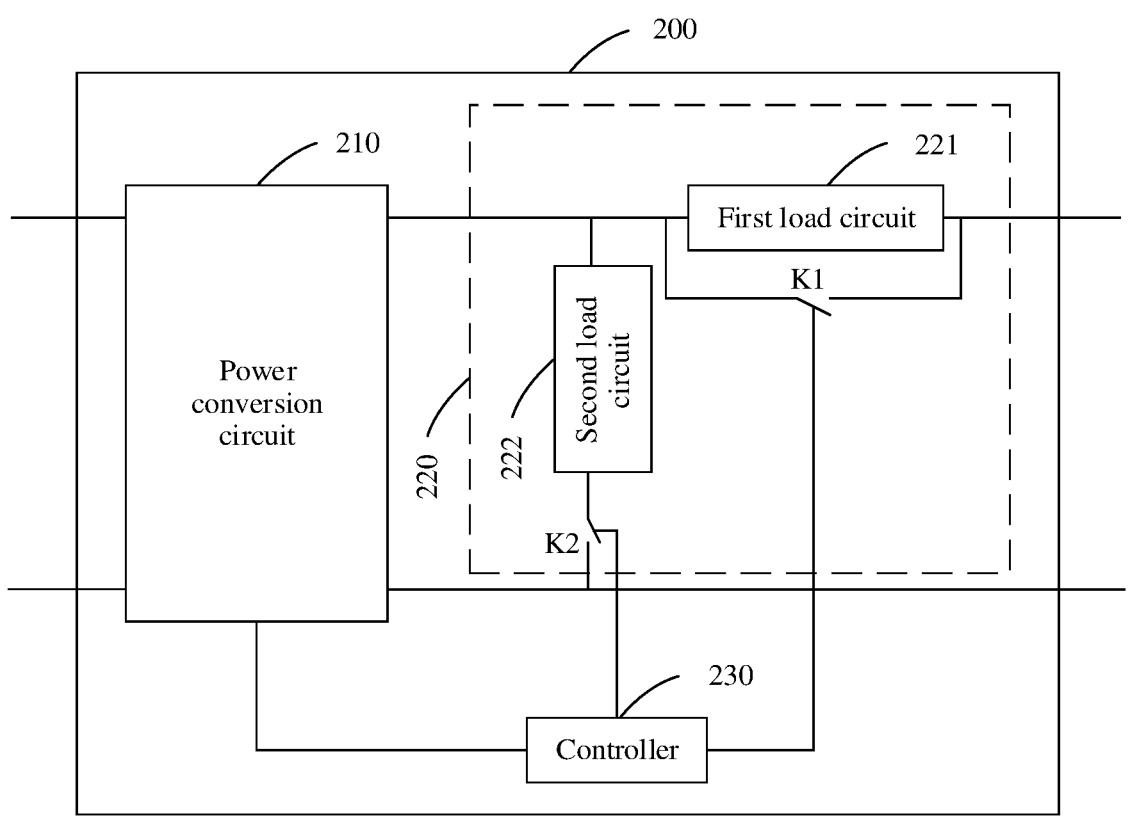
FIG. 5b is a schematic structural diagram 5 of a power conversion apparatus according to an embodiment.

During specific implementation, the impedance adjustable circuit 220 may alternatively be implemented in a manner shown in FIG. 5a. The impedance adjustable circuit 220 includes a first impedance adjustable circuit and a second impedance adjustable circuit, a first end of the first impedance adjustable circuit is connected in series to a first output end of the power conversion circuit 210, and the second impedance adjustable circuit is connected in parallel between a second end of the first impedance adjustable circuit and a second output end of the power conversion circuit 210, and the first switch K1 and the second switch K2 are further connected to the control circuit 230. Alternatively, as shown in FIG. 5b, the second impedance adjustable circuit is connected in parallel to the power conversion circuit 210, and the first impedance adjustable circuit is connected in series to the second impedance adjustable circuit. The first impedance adjustable circuit includes a first switch K1 and a first load circuit 221, the first switch K1 is connected in parallel to the first load circuit 221, the second impedance adjustable circuit includes a second switch K2 and a second load circuit 222, the second switch K2 is connected in series to the second load circuit 222, and the first switch K1 and the second switch K2 are further connected to the control circuit 230.

When the power conversion apparatus 200 does not satisfy the start condition, the control circuit 230 controls the first switch K1 to be in a first state, and controls the second switch K2 to be in a first state or a second state; or when the power conversion apparatus 200 satisfies the start condition, the control circuit 230 controls at least one of the first switch K1 and the second switch K2 to be in a state that is different from a state corresponding to the at least one switch when the power conversion apparatus 200 does not satisfy the start condition.

The first state may be an off state, and the second state may be an on state, and in this case, a state different from the first state is an on state or switching between an off state and an on state according to a first law, and a state different from the second state is an off state or switching between an off state and an on state according to a second law; or the first state is an off state, and the second state is an off state, and in this case, a state different from the first state is an on state or switching between an off state and an on state according to a first law, and a state different from the second state is an on state or switching between an off state and an on state according to a second law; or the first state is an on state, and the second state is an off state, and in this case, a state different from the first state is an off state or switching between an off state and an on state according to a first law, and a state different from the second state is an on state or switching between an off state and an on state according to a second law; or the first state is an on state, and the second state is an on state, and in this case, a state different from the first state is an off state or switching between an off state and an on state according to a first law, and a state different from the second state is an off state or switching between an off state and an on state according to a second law, where the first law may be the same as or different from the second law.

For example, when the power conversion apparatus 200 does not satisfy the start condition, the first switch K1 may be in an on state, the second switch K2 may be in an on state, and the first impedance is an output impedance of the second load circuit 222; or when the power conversion apparatus 200 satisfies the start condition, the first switch K1 may be in an off state, the second switch K2 may be in an off state, and the second impedance is an output impedance of the first load circuit 221. In such a scenario, when an output impedance of the power conversion apparatus 200 is an impedance obtained after an output impedance of the power conversion circuit 210 and the output impedance of the second load circuit 222 are connected in parallel, it can be represented that a status of the power conversion apparatus 200 is that the power conversion apparatus 200 does not satisfy the start condition, or that the power conversion apparatus 200 satisfies the start condition but the power conversion apparatus 200 is faulty. When an output impedance of the power conversion apparatus 200 is an impedance obtained after an output impedance of the power conversion circuit 210 and the output impedance of the first load circuit 221 are connected in series, it can be represented that a status of the power conversion apparatus 200 is that the power conversion apparatus 200 satisfies the start condition and that the power conversion apparatus 200 is normal. Alternatively, when the power conversion apparatus 200 does not satisfy the start condition, the first switch K1 may be in an off state, the second switch K2 may be in an off state, and the first impedance is an output impedance of the first load circuit 221; or when the power conversion apparatus 200 satisfies the start condition, the first switch K1 may be in an on state, the second switch K2 may be in an on state, and the second impedance is an output impedance of the second load circuit 222. In such a scenario, when an output impedance of the power conversion apparatus 200 is an impedance obtained after an output impedance of the power conversion circuit 210 and the output impedance of the first load circuit 221 are connected in series, it can be represented that a status of the power conversion apparatus 200 is that the power conversion apparatus 200 does not satisfy the start condition, or that the power conversion apparatus 200 satisfies the start condition but the power conversion apparatus 200 is faulty. When an output impedance of the power conversion apparatus 200 is an impedance obtained after an output impedance of the power conversion circuit 210 and the output impedance of the second load circuit 222 are connected in parallel, it can be represented that a status of the power conversion apparatus 200 is that the power conversion apparatus 200 satisfies the start condition and that the power conversion apparatus 200 is normal.

For another example, when the power conversion apparatus 200 does not satisfy the start condition, the first switch K1 may be in an on state, the second switch K2 may be in an off state, and the first impedance is zero; or when the power conversion apparatus 200 satisfies the start condition, the first switch K1 may be in an off state, the second switch K2 may be in an off state, and the second impedance is an output impedance of the first load circuit 221. In such a scenario, when an output impedance of the power conversion apparatus 200 is an output impedance of the power conversion circuit 210, it can be represented that a status of the power conversion apparatus 200 is that the power conversion apparatus 200 does not satisfy the start condition, or that the power conversion apparatus 200 satisfies the start condition but the power conversion apparatus 200 is faulty. When an output impedance of the power conversion apparatus 200 is an impedance obtained after an output impedance of the power conversion circuit 210 and the output impedance of the first load circuit 221 are connected in series, it can be represented that a status of the power conversion apparatus 200 is that the power conversion apparatus 200 satisfies the start condition and that the power conversion apparatus 200 is normal. Alternatively, when the power conversion apparatus 200 does not satisfy the start condition, the first switch K1 may be in an off state, the second switch K2 may be in an off state, and the first impedance is an output impedance of the first load circuit 221; or when the power conversion apparatus 200 satisfies the start condition, the first switch K1 may be in an on state, the second switch K2 may be in an off state, and the second impedance is zero. In such a scenario, when an output impedance of the power conversion apparatus 200 is an impedance obtained after an output impedance of the power conversion circuit 210 and the output impedance of the first load circuit 221 are connected in series, it can be represented that a status of the power conversion apparatus 200 is that the power conversion apparatus 200 does not satisfy the start condition, or that the power conversion apparatus 200 satisfies the start condition but the power conversion apparatus 200 is faulty. When an output impedance of the power conversion apparatus 200 is an output impedance of the power conversion circuit 210, it can be represented that a status of the power conversion apparatus 200 is that the power conversion apparatus 200 satisfies the start condition and that the power conversion apparatus 200 is normal.

For still another example, when the power conversion apparatus 200 does not satisfy the start condition, the first switch K1 may be in an on state, the second switch K2 may be in an off state, and the first impedance is zero; or when the power conversion apparatus 200 satisfies the start condition, the first switch K1 may be in an on state, the second switch K2 may be in an on state, and the second impedance is an output impedance of the second load circuit 222. In such a scenario, when an output impedance of the power conversion apparatus 200 is an output impedance of the power conversion circuit 210, it can be represented that a status of the power conversion apparatus 200 is that the power conversion apparatus 200 does not satisfy the start condition, or that the power conversion apparatus 200 satisfies the start condition but the power conversion apparatus 200 is faulty. When an output impedance of the power conversion apparatus 200 is an impedance obtained after an output impedance of the power conversion circuit 210 and the output impedance of the second load circuit 222 are connected in parallel, it can be represented that a status of the power conversion apparatus 200 is that the power conversion apparatus 200 satisfies the start condition and that the power conversion apparatus 200 is normal. Alternatively, when the power conversion apparatus 200 does not satisfy the start condition, the first switch K1 may be in an on state, the second switch K2 may be in an on state, and the first impedance is an output impedance of the second load circuit 222; or when the power conversion apparatus 200 satisfies the start condition, the first switch K1 may be in an on state, the second switch K2 may be in an off state, and the second impedance is zero. In such a scenario, when an output impedance of the power conversion apparatus 200 is an impedance obtained after an output impedance of the power conversion circuit 210 and the output impedance of the second load circuit 222 are connected in parallel, it can be represented that a status of the power conversion apparatus 200 is that the power conversion apparatus 200 does not satisfy the start condition, or that the power conversion apparatus 200 satisfies the start condition but the power conversion apparatus 200 is faulty. When an output impedance of the power conversion apparatus 200 is an output impedance of the power conversion circuit 210, it can be represented that a status of the power conversion apparatus 200 is that the power conversion apparatus 200 satisfies the start condition and that the power conversion apparatus 200 is normal.

It should be noted that the foregoing only uses examples for describing the possible states of the first switch K1 and the second switch K2 when the power conversion apparatus 200 does not satisfy the start condition and the power conversion apparatus 200 satisfies the start condition. When the first switch K1 and the second switch K2 are in other possible states, the output impedance of the power conversion apparatus 200 and the working status represented by the output impedance of the power conversion apparatus 200 are similar to those in the foregoing several possible scenarios. Details are not described herein again.

Further, when the power conversion apparatus 200 satisfies the start condition, after the control circuit 230 controls the at least one of the first switch K1 and the second switch K2 to be in the state that is different from the state corresponding to the at least one switch when the power conversion circuit 200 does not satisfy the start condition, the apparatus 200 is further configured to: receive first instruction information, and control, according to the first instruction information, at least one of the first switch K1 and the second switch K2 to be in a state that is different from a state corresponding to the at least one switch when the power conversion apparatus 200 satisfies the start condition, so that an output impedance of the power conversion apparatus 200 when the power conversion apparatus 200 normally works is different from an output impedance of the power conversion apparatus 200 when the power conversion apparatus 200 satisfies the start condition.

For example, after the control circuit 230 controls the at least one of the first switch K1 and the second switch K2 to be in the state that is different from the state corresponding to the at least one switch when the power conversion apparatus 200 does not satisfy the start condition, the apparatus 200 is further configured to: receive the first instruction information, where the first instruction information is used to instruct the control circuit 230 to control work of the power conversion circuit 210; and according to the first instruction information, control the first switch K1 to be closed and the second switch K2 to be open, control the power conversion circuit 210 to adjust power input to the power conversion circuit, and output adjusted power, so that when the power conversion circuit 210 works, the first load circuit 221 is short-circuited and the second load circuit 222 is in an open-circuit state, and therefore the first load circuit 221 and the second load circuit 222 do not affect normal work of the power conversion apparatus 200.

Alternatively, when the power conversion apparatus 200 satisfies the start condition, after the control circuit 230 controls the at least one of the first switch K1 and the second switch K2 to be in the state that is different from the state corresponding to the at least one switch when the power conversion apparatus 200 does not satisfy the start condition, the apparatus 200 is further configured to: detect whether a voltage, a current, or power of an output end of the power conversion apparatus 200 changes; and when determining that the voltage, the current, or the power of the output end of the power conversion apparatus 200 changes, control at least one of the first switch K1 and the second switch K2 to be in a state that is different from a state corresponding to the at least one switch when the power conversion apparatus 200 satisfies the start condition, so that an output impedance of the power conversion apparatus 200 when the power conversion apparatus 200 normally works is different from an output impedance of the power conversion apparatus 200 when the power conversion apparatus 200 satisfies the start condition.

For example, after the control circuit 230 controls the at least one of the first switch K1 and the second switch K2 to be in the state that is different from the state corresponding to the at least one switch when the power conversion apparatus 200 does not satisfy the start condition, the apparatus 200 is further configured to: determine whether a voltage, a current, or power of an output end of the power conversion apparatus 200 changes; and when determining that the voltage, the current, or the power of the output end of the power conversion apparatus 200 changes, control the first switch K1 to be closed and the second switch K2 to be open. In this case, the first load circuit 221 is short-circuited and the second load circuit 222 is in an open-circuit state, and therefore the first load circuit 221 and the second load circuit 222 do not affect normal work of the power conversion apparatus 200.

It should be noted that a structure of the power conversion circuit 210 is not specifically limited in the embodiments provided herein, and all circuit structures that can implement a power conversion function are applicable to the embodiments provided herein. For example, the power conversion circuit 210 may be a boost circuit, a buck circuit, or a combination of a boost circuit and a buck circuit. Specific structures of the first load circuit 221 and the second load circuit 222 are not limited in the embodiments provided herein. The first load circuit 221 and the second load circuit 222 each may be constituted by at least one component such as a capacitor, a resistor, and an inductor in series connection, parallel connection, or series-parallel connection. The output impedances of the first load circuit 221 and the second load circuit 222 may have one type of impedance characteristic or a combination of impedance characteristic such as a resistive characteristic, an inductive characteristic, a capacitive characteristic, or a rectification characteristic. Impedance characteristics of the output impedances of the first load circuit 221 and the second load circuit 222 may be identical or different.

In addition, specific types of the first switch K1 and the second switch K2 are not limited in the embodiments provided herein. The first switch K1 and the second switch K2 each may be a mechanical switch such as a relay, or may be a semiconductor switch such as a transistor, a metal oxide semiconductor (MOS) transistor, an insulated gate bipolar transistor (IGBT), or a gallium nitride GaN transistor.

According to the solution, the output impedance of the impedance adjustable circuit 220 is the first impedance when the power conversion apparatus 200 does not satisfy the start condition, or the output impedance of the impedance adjustable circuit 220 is the second impedance when the power conversion apparatus 200 satisfies the start condition, so that an output impedance of the power conversion apparatus 200 when the power conversion apparatus 200 does not satisfy the start condition is different from an output impedance of the power conversion apparatus 200 when the power conversion apparatus 200 satisfies the start condition. In this way, the working status of the power conversion apparatus 200 can be represented by the output impedance of the power conversion apparatus 200, and the determined working status of the power conversion apparatus is more accurate than a working status of the power conversion apparatus determined in a voltage detection manner in the prior art. For example, if the output impedance of the power conversion apparatus 200 when the power conversion apparatus 200 does not satisfy the start condition is 'a' (which is determined based on the first impedance and the impedance of the power conversion circuit 210), and the output impedance of the power conversion apparatus 200 when the power conversion apparatus 200 satisfies the start condition is 'b' (which is determined based on the second impedance and the impedance of the power conversion circuit 210), when the output impedance of the power conversion apparatus 200 is 'a,' it can be represented that the status of the power conversion apparatus 200 is that the power conversion apparatus 200 does not satisfy the start condition, or that the power conversion apparatus 200 satisfies the start condition but the power conversion apparatus 200 is faulty. When the output impedance of the power conversion apparatus 200 is 'b,' it can be represented that the status of the power conversion apparatus 200 is that the power conversion apparatus 200 satisfies the start condition and that the power conversion apparatus 200 is normal.

Figure 6:
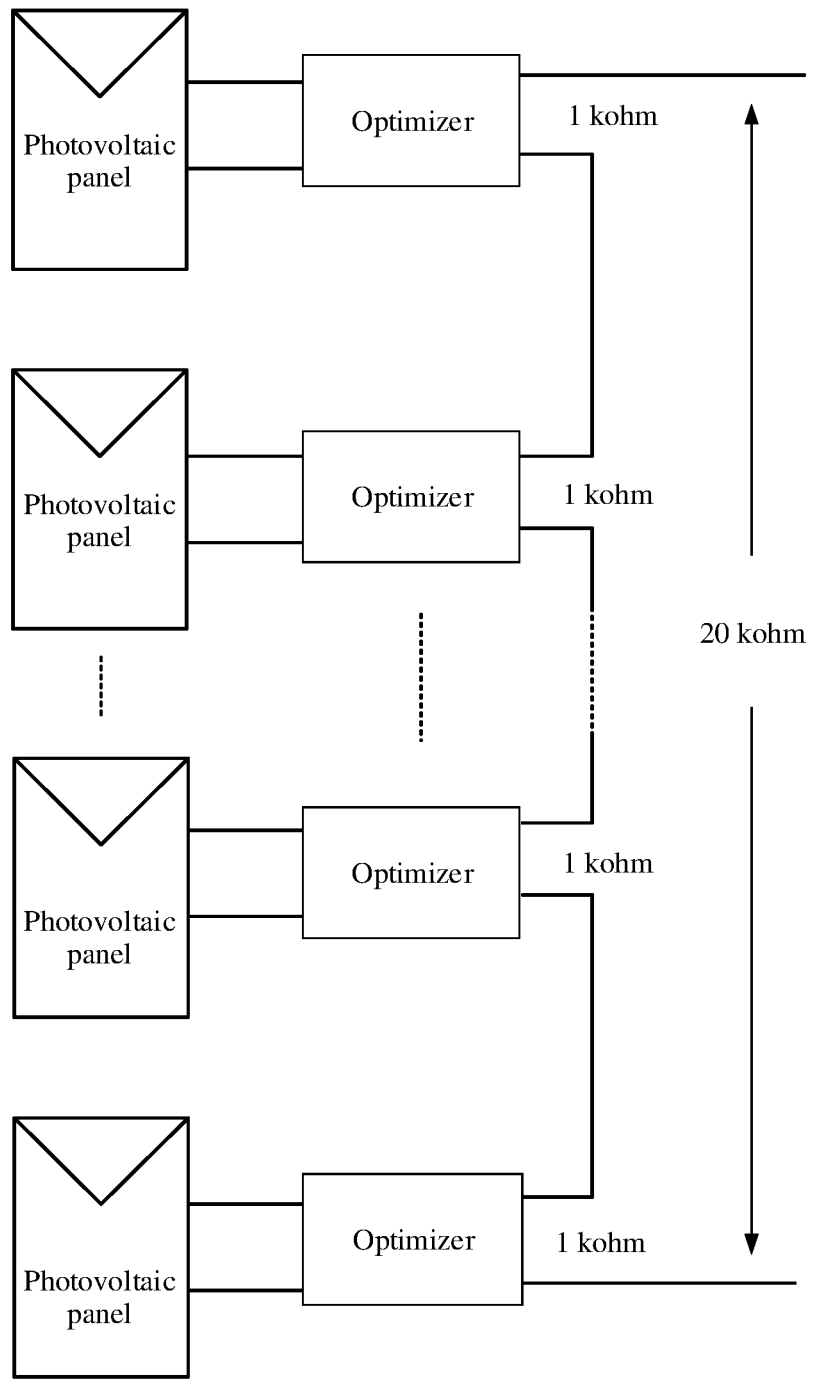
FIG. 6 is a schematic diagram of a connection manner of a power conversion apparatus according to an embodiment.

For example, when the power conversion apparatus 200 is an optimizer in a photovoltaic power system, if the optimizer satisfies the start condition and is normal, an output impedance of the optimizer is 1 kohm. In this case, after a single optimizer is connected to a photovoltaic module and is powered on, if it is detected that an output impedance of the optimizer is 1 kohm, it indicates that the optimizer satisfies the start condition and normally works; otherwise, it indicates that the optimizer is faulty. When a plurality of optimizers are connected in series, as shown in FIG. 6, by measuring a total output impedance of this series branch, whether the optimizers in this series branch are normal can be determined, and a quantity of optimizers that are connected in this series branch can also be determined. For example, when output ends of 20 optimizers are connected in series, if a measured total impedance of this series branch is 20 kohm, it indicates that the optimizers in series normally work and wiring is normal. If a measured total impedance of this series branch is another value, it indicates that wiring in series is abnormal or some optimizers in this series branch are abnormal. The total impedance of this series branch may be measured by using a multimeter or another impedance detection apparatus. Likewise, when the output ends of the plurality of the optimizers in series shown in FIG. 6 are connected in parallel, a total impedance obtained after parallel connection may be tested to determine whether an optimizer is faulty or wiring is abnormal.

Based on a similar inventive concept, an exemplary embodiment provided herein may also provide a method for controlling an output impedance of a power conversion apparatus. An output impedance of the power conversion apparatus when no signal is input and an output impedance of the power conversion apparatus when a signal is input but no signal is output are set, which may function to make corresponding output impedances of the power conversion apparatus different when the power conversion apparatus is in different working statuses (for example, the power conversion apparatus is faulty or there is no input to the power conversion apparatus). In this way, the working status of the power conversion apparatus can be represented by the output impedance of the power conversion apparatus. The power conversion apparatus is configured to adjust power input to the power conversion apparatus and output adjusted power, and may specifically be an optimizer.

Figure 7:
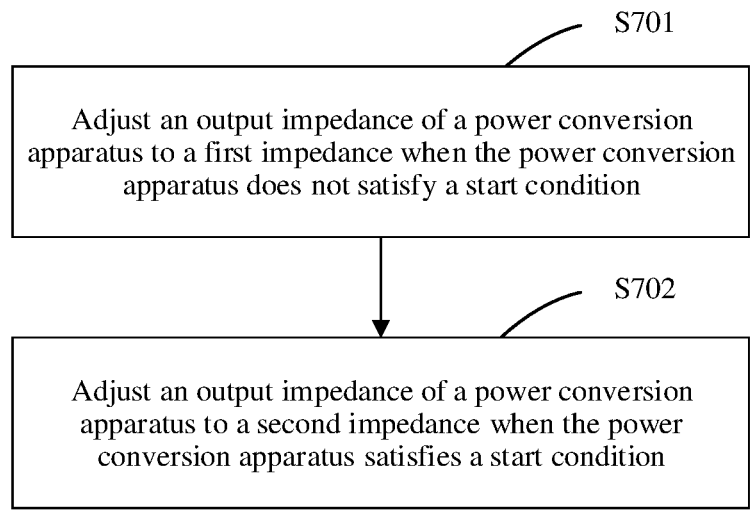
FIG. 7 is a schematic flowchart of a method for controlling an output impedance of a power conversion apparatus according to an embodiment.

As shown in FIG. 7, the method for controlling the output impedance of the power conversion apparatus mainly includes the following steps:

S701. Adjust the output impedance of the power conversion apparatus to a first impedance when the power conversion apparatus does not satisfy a start condition.

S702. Adjust the output impedance of the power conversion apparatus to a second impedance when the power conversion apparatus satisfies a start condition, where the first impedance is not equal to the second impedance.

For example, in a scenario in which the power conversion apparatus includes a power conversion circuit, an impedance adjustable circuit, and a control circuit, where the control circuit is connected to both the power conversion circuit and the impedance adjustable circuit, and an output end of the power conversion circuit is connected to the impedance adjustable circuit, that is, in a scenario in which the power conversion apparatus is of the structure shown in FIG. 2, the power conversion apparatus specifically makes impedance adjustments in the following manners. The power conversion apparatus adjusts the output impedance of the power conversion apparatus to the first impedance when the power conversion apparatus does not satisfy the start condition as follows: adjusting an impedance of the impedance adjustable circuit to a third impedance when the power conversion apparatus does not satisfy the start condition, where the third impedance is determined based on an equivalent impedance of the power conversion circuit when the power conversion circuit does not satisfy the start condition and the first impedance. The power conversion apparatus adjusts the output impedance of the power conversion apparatus to the second impedance when the power conversion apparatus satisfies the start condition as follows: adjusting an impedance of the impedance adjustable circuit to a fourth impedance when the power conversion apparatus satisfies the start condition, where the fourth impedance is determined based on an equivalent impedance of the power conversion circuit when the power conversion circuit satisfies the start condition and the second impedance. The impedance adjustable circuit may be implemented by using, but not limited to, the structure shown in FIG. 3, FIG. 4, FIG. 5a, or FIG. 5b. When the impedance adjustable circuit is implemented by using the structure shown in FIG. 3, FIG. 4, FIG. 5a, or FIG. 5b, for a method for adjusting the output impedance of the impedance adjustable circuit, reference may be made to the method for controlling a corresponding output impedance of the impedance adjustable circuit by the control circuit 230 in the foregoing apparatus embodiments. Details are not described herein again.

In a scenario in which the power conversion apparatus includes a buck circuit, the power conversion apparatus specifically makes impedance adjustments in the following manners. The power conversion apparatus adjusts the output impedance of the power conversion apparatus to the first impedance when the power conversion apparatus does not satisfy the start condition as follows: controlling a status of a first-type switch to change according to a first law when the power conversion apparatus does not satisfy the start condition, where the first-type switch is a switch that can change an output impedance of the buck circuit and that is in the buck circuit, and the first law is determined based on the first impedance. The power conversion apparatus adjusts the output impedance of the power conversion apparatus to the second impedance when the power conversion apparatus satisfies the start condition as follows: controlling a status of a first-type switch to change according to a second law when the power conversion apparatus satisfies the start condition, where the second law is determined based on the second impedance. In other words, the buck circuit not only can be configured to adjust the output impedance of the power conversion apparatus when the power conversion apparatus does not satisfy the start condition and when the power conversion apparatus satisfies the start condition, but also can be configured to adjust output power of the power conversion apparatus when the power conversion apparatus satisfies the start condition and needs to adjust the output power of the power conversion apparatus. No new circuit structure needs to be added to the power conversion apparatus.

Further, when satisfying the start condition, the power conversion apparatus further controls a second-type switch to be in an off state, where the second-type switch is a switch, in the buck circuit, configured to directly connect to a power source.

Figure 8:
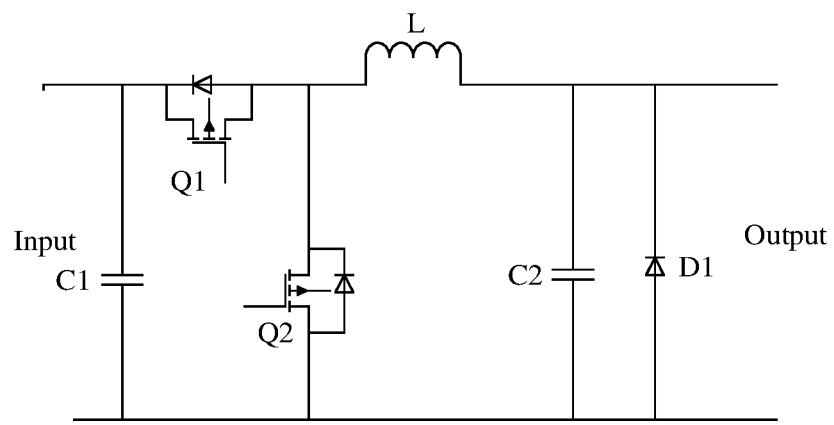
FIG. 8 is a schematic structural diagram of a control power conversion apparatus according to an embodiment.

In a specific implementation, as shown in FIG. 8, the buck circuit includes a first capacitor C1, a first switch Q1, a second switch Q2, an inductor L, and a second capacitor C2. A first end of the first capacitor C1 is connected to a first end of the first switch Q1, a second end of the first switch Q1 is connected to both a first end of the inductor L and a first end of the second switch Q2, a third end of the first switch Q1 is configured to input a signal for controlling a status of the first switch Q1, a second end of the second switch Q2 is connected to both a second end of the first capacitor C1 and a first end of the second capacitor C2, a third end of the second switch Q2 is configured to input a signal for controlling a status of the second switch Q2, and a second end of the inductor L is connected to a second end of the second capacitor C2. The first-type switch is the second switch Q2, and the second-type switch is the first switch Q1.

Further, the buck circuit may further include a diode D1, where an anode of the diode D1 is connected to the first end of the second capacitor C2, and a cathode of the diode D1 is connected to the second end of the second capacitor C2.

In this case, the first law may be that the second switch Q2 is normally open (kept open), and the second law is that the second switch Q2 is normally closed (kept closed); or the first law may be that the second switch Q2 is normally open, and the second law is that the second switch Q2 is switched between an on state and an off state according to a specified rule; or the first law may be that the second switch Q2 is normally closed, and the second law is that the second switch Q2 is normally open; or the first law may be that the second switch Q2 is normally closed, and the second law is that the second switch Q2 is switched between an on state and an off state according to a specified rule. For example, when the second law is that the second switch Q2 is switched between an on state and an off state according to the specified rule, the specified rule includes a frequency at which the second switch Q2 is switched between an on state and an off state and a duration during which the second switch Q2 is in an on state (or an off state). The specified rule is determined based on the second impedance.

In a scenario in which the power conversion apparatus includes a boost circuit, the power conversion apparatus specifically makes impedance adjustments in the following manners. The power conversion apparatus adjusts the output impedance of the power conversion apparatus to the first impedance when the power conversion apparatus does not satisfy the start condition as follows: controlling a status of a first-type switch to change according to a first law when the power conversion apparatus does not satisfy the start condition, where the first-type switch is a switch that can change an output impedance of the boost circuit and that is in the boost circuit, and the first law is determined based on the first impedance. The power conversion apparatus adjusts the output impedance of the power conversion apparatus to the second impedance when the power conversion apparatus satisfies the start condition as follows: controlling a status of a first-type switch to change according to a second law when the power conversion apparatus satisfies the start condition, where the second change law is determined based on the second impedance. In other words, the boost circuit not only can be configured to adjust the output impedance of the power conversion apparatus when the power conversion apparatus does not satisfy the start condition and when the power conversion apparatus satisfies the start condition, but also can be configured to adjust output power of the power conversion apparatus when the power conversion apparatus satisfies the start condition and needs to adjust the output power of the power conversion apparatus. No new circuit structure needs to be added to the power conversion apparatus.

Further, when satisfying the start condition, the power conversion apparatus further controls a second-type switch to be in an off state, where the second-type switch is a switch, in the boost circuit, that is directly connected to a power source.

Figure 9:
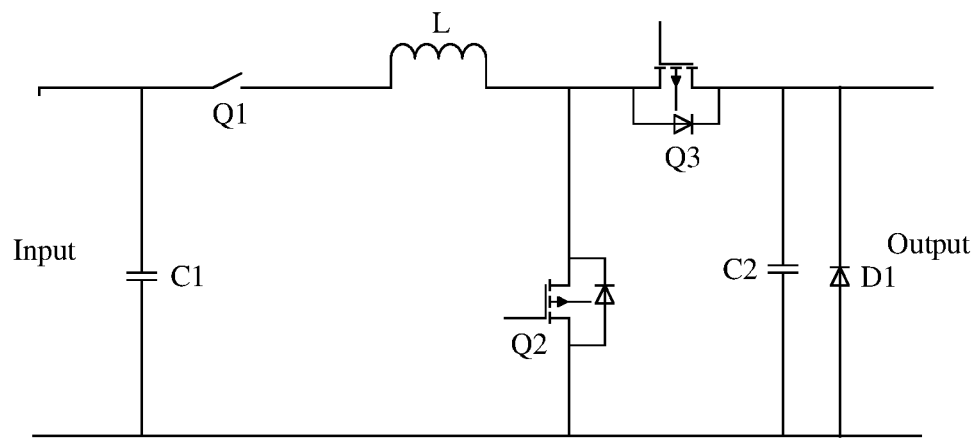
FIG. 9 is a schematic structural diagram of another control power conversion apparatus according to an embodiment.

In a specific implementation, as shown in FIG. 9, the boost circuit includes a first capacitor C1, a first switch Q1, an inductor L, a second switch Q2, a third switch Q3, and a second capacitor C2. A first end of the first capacitor C1 is connected to a first end of the first switch, a second end of the first switch Q1 is connected to a first end of the inductor L, a second end of the inductor L is connected to both a first end of the second switch Q2 and a first end of the third switch Q3, a second end of the first capacitor C1 is connected to both a second end of the second switch Q2 and a first end of the second capacitor C2, a second end of the third switch Q3 is connected to a second end of the second capacitor C2, a third end of the first switch Q1 is configured to input a signal for controlling a status of the first switch Q1, a third end of the second switch Q2 is configured to input a signal for controlling a status of the second switch Q2, and a third end of the third switch Q3 is configured to input a signal for controlling a status of the third switch Q3. In this case, the first-type switch is the second switch Q2 and the third switch Q3, and the second-type switch is the first switch Q1.

Further, the boost circuit may further include a diode D1, where an anode of the diode D1 is connected to the first end of the second capacitor, and a cathode of the diode D1 is connected to the second end of the second capacitor C2.

The first law may be that the second switch Q2 is normally closed, and the third switch Q3 is normally open; or the first law may be that the second switch Q2 is normally open, and the third switch Q3 is normally open; or the first law may be that the second switch Q2 is normally open, and the third switch Q3 is normally closed; or the first law may be that the second switch Q2 is normally closed, and the third switch Q3 is normally closed. The second law may be that the status of the second switch Q2 changes according to any one of the following laws: normally closed, normally open, and switched between an on state and an off state according to a first rule, and that the status of the third switch Q3 changes according to any one of the following laws: switched between an on state and an off state according to a second rule, or normally closed. In addition, at least one of the change law corresponding to the second switch Q2 in the second law and the change law corresponding to the third switch Q3 in the second law is different from a corresponding change law in the first law. The first rule includes a frequency at which the second switch Q2 is switched between an on state and an off state and a duration during which the second switch Q2 is in an on state (or an off state), and the second rule includes a frequency at which the third switch Q3 is switched between an on state and an off state and a duration during which the third switch Q3 is in an on state (or an off state). The first rule and the second rule are determined based on the second impedance.

For example, the first law may be that the second switch Q2 is normally closed, and the third switch Q3 is normally open. In this case, the second law may be that the second switch Q2 is switched between an on state and an off state according to the first rule, and that the third switch Q3 is switched between an on state and an off state according to the second rule; or the second law may be that the second switch Q2 is switched between an on state and an off state according to the first rule, and that the third switch Q3 is normally closed; or the second law may be that the second switch Q2 is normally closed, and that the third switch Q3 is normally closed; or the second law may be that the second switch Q2 is normally open, and that the third switch Q3 is normally closed; or the second law may be that the second switch Q2 is normally closed, and that the third switch Q3 is switched between an on state and an off state according to the second rule; or the second law may be that the second switch Q2 is normally open, and that the third switch Q3 is switched between an on state and an off state according to the second rule.

In a scenario in which the power conversion apparatus includes a buck-boost circuit, the power conversion apparatus specifically makes impedance adjustments in the following manners. The power conversion apparatus adjusts the output impedance of the power conversion apparatus to the first impedance when the power conversion apparatus does not satisfy the start condition as follows: controlling a status of a first-type switch to change according to a first law when the power conversion apparatus does not satisfy the start condition, where the first-type switch is a switch that can change the output impedance of the power conversion apparatus and that is in the buck-boost circuit, and the first law is determined based on the first impedance. The power conversion apparatus adjusts the output impedance of the power conversion apparatus to the second impedance when the power conversion apparatus satisfies the start condition as follows: controlling a status of a first-type switch to change according to a second law when the power conversion apparatus satisfies the start condition, where the second law is determined based on the second impedance. In other words, the buck-boost circuit not only can be configured to adjust the output impedance of the power conversion apparatus when the power conversion apparatus does not satisfy the start condition and when the power conversion apparatus satisfies the start condition, but also can be configured to adjust output power of the power conversion apparatus when the power conversion apparatus satisfies the start condition and needs to adjust the output power of the power conversion apparatus. No new circuit structure needs to be added to the power conversion apparatus.

Further, when satisfying the start condition, the power conversion apparatus further controls a second-type switch to be in an off state, where the second-type switch is a switch, in the buck-boost circuit, that is directly connected to a power source.

Figure 10:
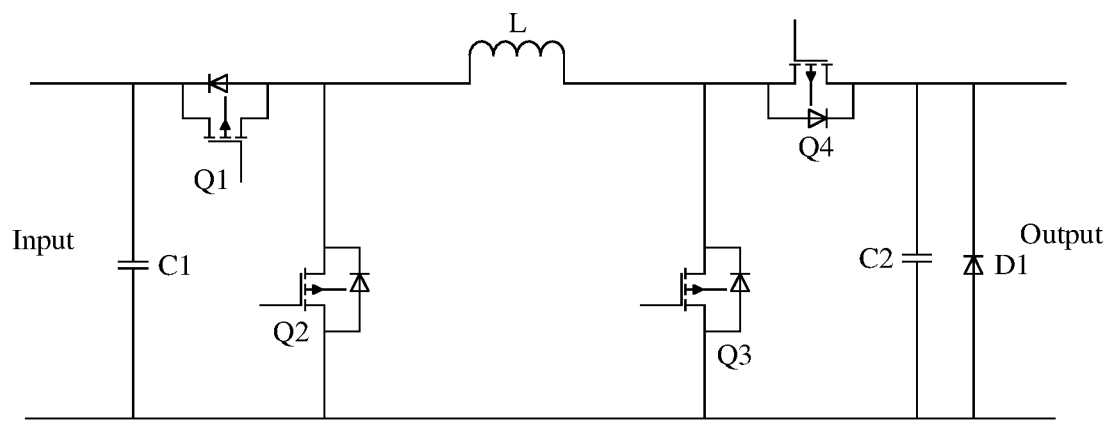
FIG. 10 is a schematic structural diagram of still another control power conversion apparatus according to an embodiment.

In a specific implementation, as shown in FIG. 10, the buck-boost circuit includes a first capacitor C1, a first switch Q1, a second switch Q2, an inductor L, a third switch Q3, a fourth switch Q4, and a second capacitor C2. A first end of the first capacitor C1 is connected to a first end of the first switch Q1, a second end of the first capacitor C2 is connected to all of a first end of the second switch Q2, a first end of the third switch Q3, and a first end of the second capacitor C2, a second end of the first switch Q1 is connected to both a first end of the inductor L and a second end of the second switch Q2, a second end of the inductor L is connected to both a second end of the third switch Q3 and a first end of the fourth switch Q4, a second end of the fourth switch Q4 is connected to a second end of the second capacitor C2, a third end of the first switch Q1 is configured to input a signal for controlling a status of the first switch Q1, a third end of the second switch Q2 is configured to input a signal for controlling a status of the second switch Q2, a third end of the third switch Q3 is configured to input a signal for controlling a status of the third switch Q3, and a third end of the fourth switch Q4 is configured to input a signal for controlling a status of the fourth switch Q4. In this case, the first-type switch is the third switch Q3 and the fourth switch Q4, the first-type switch is the second switch Q2 and the fourth switch Q4, or the first-type switch is the second switch Q2, the third switch Q3, and the fourth switch Q4; and the second-type switch is the first switch Q1.

Further, the buck-boost circuit may further include a diode D1, where an anode of the diode D1 is connected to the first end of the second capacitor C2, and a cathode of the diode D1 is connected to the second end of the second capacitor C2.

When the first-type switch is the second switch Q2 and the fourth switch Q4, the first law may be that the second switch Q2 is normally closed, and the fourth switch Q4 is normally open; or the first law is that the second switch Q2 is normally open, and the fourth switch Q4 is normally open; or the first law is that the second switch Q2 is normally closed, and the fourth switch Q4 is normally closed; or the first law may be that the second switch Q2 is normally open, and the fourth switch Q4 is normally closed. The second law is that the status of the second switch Q2 changes according to any one of the following laws: normally closed, normally open, and switched between an on state and an off state according to a first rule, and that the status of the fourth switch Q4 changes according to any one of the following laws: switched between an on state and an off state according to a second rule, or normally closed. In addition, at least one of the change law corresponding to the second switch Q2 in the second law and the change law corresponding to the fourth switch Q4 in the second law is different from a corresponding change law in the first law. The first rule includes a frequency at which the second switch Q2 is switched between an on state and an off state and a duration during which the second switch Q2 is in an on state (or an off state), and the second rule includes a frequency at which the fourth switch Q4 is switched between an on state and an off state and a duration during which the fourth switch Q4 is in an on state (or an off state). The first rule and the second rule are determined based on the second impedance.

For example, the first law may be that the second switch Q2 is normally closed, and the fourth switch Q4 is normally open. In this case, the second law may be that the second switch Q2 is switched between an on state and an off state according to the first rule, and that the fourth switch Q4 is switched between an on state and an off state according to the second rule; or the second law is that the second switch Q2 is switched between an on state and an off state according to the first rule, and that the fourth switch Q4 is normally closed; or the second law is that the second switch Q2 is normally closed, and that the fourth switch Q4 is normally closed; or the second law is that the second switch Q2 is normally open, and that the fourth switch Q4 is normally closed; or the second law is that the second switch Q2 is normally closed, and that the fourth switch Q4 is switched between an on state and an off state according to the second rule; or the second law is that the second switch Q2 is normally open, and that the fourth switch Q4 is switched between an on state and an off state according to the second rule.

When the first-type switch is the third switch Q3 and the fourth switch Q4, the first law may be that the third switch Q3 is normally closed, and the fourth switch Q4 is normally open; or the first law is that the third switch Q3 is normally open, and the fourth switch Q4 is normally open; or the first law is that the third switch Q3 is normally closed, and the fourth switch Q4 is normally closed; or the first law may be that the third switch Q3 is normally open, and the fourth switch Q4 is normally closed. The second law is that the status of the third switch Q3 changes according to any one of the following laws: normally closed, normally open, and switched between an on state and an off state according to a first rule, and that the status of the fourth switch Q4 changes according to any one of the following laws: switched between an on state and an off state according to a second rule, or normally closed. In addition, at least one of the change law corresponding to the third switch Q3 in the second law and the change law corresponding to the fourth switch Q4 in the second law is different from a corresponding change law in the first law. The first rule includes a frequency at which the third switch Q3 is switched between an on state and an off state and a duration during which the third switch Q3 is in an on state (or an off state), and the second rule includes a frequency at which the fourth switch Q4 is switched between an on state and an off state and a duration during which the fourth switch Q4 is in an on state (or an off state). The first rule and the second rule are determined based on the second impedance.

For example, the first law may be that the third switch Q3 is normally closed, and the fourth switch Q4 is normally open. In this case, the second law is that the third switch Q3 is switched between an on state and an off state according to the first rule, and that the fourth switch Q4 is switched between an on state and an off state according to the second rule; or the second law is that the third switch Q3 is switched between an on state and an off state according to the first rule, and that the fourth switch Q4 is normally closed; or the second law is that the third switch Q3 is normally closed, and that the fourth switch Q4 is normally closed; or the second law is that the third switch Q3 is normally open, and that the fourth switch Q4 is normally closed; or the second law is that the third switch Q3 is normally closed, and that the fourth switch Q4 is switched between an on state and an off state according to the second rule; or the second law is that the third switch Q3 is normally open, and that the fourth switch Q4 is switched between an on state and an off state according to the second rule.

When the first-type switch is the second switch Q2, the third switch Q3, and the fourth switch Q4, the first law may be that the second switch Q2 is normally open, the third switch Q3 is normally open, and the fourth switch Q4 is normally open; or the first law may be that the second switch Q2 is normally open, the third switch Q3 is normally open, and the fourth switch Q4 is normally closed; or the first law may be that the second switch Q2 is normally open, the third switch Q3 is normally closed, and the fourth switch Q4 is normally open; or the first law may be that the second switch Q2 is normally open, the third switch Q3 is normally closed, and the fourth switch Q4 is normally closed; or the first law is that the second switch Q2 is normally closed, the third switch Q3 is normally open, and the fourth switch Q4 is normally open; or the first law is that the second switch Q2 is normally closed, the third switch Q3 is normally open, and the fourth switch Q4 is normally closed; or the first law may be that the second switch Q2 is normally closed, the third switch Q3 is normally closed, and the fourth switch Q4 is normally open; or the first law is that the second switch Q2 is normally closed, the third switch Q3 is normally closed, and the fourth switch Q4 is normally closed.

The second law is that the status of the second switch Q2 changes according to any one of the following laws: normally closed, normally open, and switched between an on state and an off state according to a first rule, that the status of the third switch Q3 changes according to any one of the following laws: normally closed, normally open, and switched between an on state and an off state according to a second rule, and that the status of the fourth switch Q4 changes according to any one of the following laws: switched between an on state and an off state according to a third rule, or normally closed. In addition, at least one of the change law corresponding to the second switch Q2 in the second law, the change law corresponding to the third switch Q3 in the second law, and the change law corresponding to the fourth switch Q4 in the second law is different from a corresponding change law in the first law. The first rule includes a frequency at which the second switch Q2 is switched between an on state and an off state and a duration during which the second switch Q2 is in an on state (or an off state), the second rule includes a frequency at which the third switch Q3 is switched between an on state and an off state and a duration during which the third switch Q3 is in an on state (or an off state), and the third rule includes a frequency at which the fourth switch Q4 is switched between an on state and an off state and a duration during which the fourth switch Q4 is in an on state (or an off state). The first rule, the second rule, and the third rule are determined based on the second impedance.

For example, the first law is that the second switch Q2 is normally closed, the third switch Q3 is normally closed, and the fourth switch Q4 is normally open. In this case, the second law may be that the second switch Q2 is switched between an on state and an off state according to the first rule, that the third switch Q3 may be switched between an on state and an off state according to the second rule, and that the fourth switch Q4 may be switched between an on state and an off state according to the third rule; or the second law may be that the second switch Q2 may be switched between an on state and an off state according to the first rule, that the third switch Q3 may be switched between an on state and an off state according to the second rule, and that the fourth switch Q4 is normally closed; or the second law may be that the second switch Q2 may be switched between an on state and an off state according to the first rule, that the third switch Q3 is normally closed, and that the fourth switch Q4 may be switched between an on state and an off state according to the third rule; or the second law may be that the second switch Q2 is normally open, that the third switch Q3 may be switched between an on state and an off state according to the second rule, and that the fourth switch Q4 may be switched between an on state and an off state according to the third rule; or the second law may be that the second switch Q2 is normally closed, that the third switch Q3 may be switched between an on state and an off state according to the second rule, and that the fourth switch Q4 may be switched between an on state and an off state according to the third rule; or the second law may be that the second switch Q2 may be switched between an on state and an off state according to the first rule, that the third switch Q3 is normally closed, and that the fourth switch Q4 is normally closed; or the second law may be that the second switch Q2 may be switched between an on state and an off state according to the first rule, that the third switch Q3 is normally open, and that the fourth switch Q4 is normally closed; or the second law may be that the second switch Q2 is normally open, that the third switch Q3 may be switched between an on state and an off state according to the second rule, and that the fourth switch Q4 is normally closed; or the second law may be that the second switch Q2 is normally closed, that the third switch Q3 may be switched between an on state and an off state according to the second rule, and that the fourth switch Q4 is normally closed; or the second law may be that the second switch Q2 is normally closed, that the third switch Q3 is normally closed, and that the fourth switch Q4 may be switched between an on state and an off state according to the third rule; or the second law may be that the second switch Q2 is normally closed, that the third switch Q3 is normally open, and that the fourth switch Q4 may be switched between an on state and an off state according to the third rule; or the second law may be that the second switch Q2 is normally open, that the third switch Q3 is normally closed, and that the fourth switch Q4 may be switched between an on state and an off state according to the third rule; or the second law may be that the second switch Q2 is normally closed, that the third switch Q3 is normally closed, and that the fourth switch Q4 is normally closed; or the second law may be that the second switch Q2 is normally closed, that the third switch Q3 is normally open, and that the fourth switch Q4 is normally closed; or the second law may be that the second switch Q2 is normally open, that the third switch Q3 is normally open, and that the fourth switch Q4 is normally closed; or the second law may be that the second switch Q2 is normally open, that the third switch Q3 is normally closed, and that the fourth switch Q4 is normally closed.

It should be noted that the foregoing structures of the boost circuit, the buck circuit, and the buck-boost circuit are only examples for description, but do not constitute any limitation on this embodiment. Each of the foregoing switches in the boost circuit and the buck circuit may be a transistor, a MOS transistor, an IGBT, or the like.

According to the method, the output impedance of the power conversion apparatus is adjusted to the first impedance when the power conversion apparatus does not satisfy the start condition, or the output impedance of the power conversion apparatus is adjusted to the second impedance when the power conversion apparatus satisfies the start condition, so that the output impedance of the power conversion apparatus when the power conversion apparatus does not satisfy the start condition is different from the output impedance of the power conversion apparatus when the power conversion apparatus satisfies the start condition. In this way, a working status of the power conversion apparatus can be represented by the output impedance of the power conversion apparatus, and the determined working status of the power conversion apparatus is more accurate than a working status of the power conversion apparatus determined in a voltage detection manner in the prior art. For example, when the output impedance of the power conversion apparatus is the first impedance, it can be represented that the status of the power conversion apparatus is that the power conversion apparatus does not satisfy the start condition, or that the power conversion apparatus satisfies the start condition but the power conversion apparatus is faulty. When the output impedance of the power conversion apparatus is the second impedance, it can be represented that the status of the power conversion apparatus is that the power conversion apparatus satisfies the start condition and the power conversion apparatus is normal.

Figure 11:
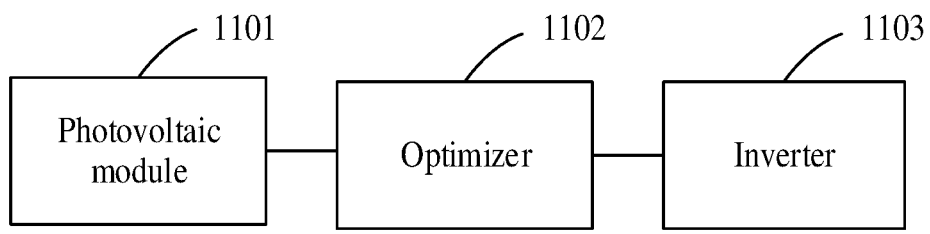
FIG. 11 is a schematic structural diagram of a photovoltaic power system according to an embodiment.

An exemplary embodiment of a photovoltaic power system may further be provided herein. As shown in FIG. 11, an exemplary photovoltaic power system includes a photovoltaic module, an optimizer, and an inverter. The photovoltaic module 1101 is configured to: convert solar energy into electrical energy, and output the obtained electrical energy to the optimizer 1102. The optimizer 1102 is configured to: adjust an output impedance of the optimizer 1102 to a first impedance when the optimizer 1102 does not satisfy a start condition, or adjust an output impedance of the optimizer 1102 to a second impedance when the optimizer 1102 satisfies a start condition, where the first impedance is not equal to the second impedance; and when the optimizer 1102 satisfies the start condition and the optimizer 1102 needs to control output power, adjust output power of the photovoltaic module 1101 and output adjusted power. The inverter 1103 is configured to: convert the power output by the optimizer 1102 into electrical energy satisfying a specified condition, and output the converted electrical energy to a power grid or a load.

In a scenario in which the optimizer 1102 includes a power conversion circuit, an impedance adjustable circuit, and a control circuit, and the control circuit is connected to both the power conversion circuit and the impedance adjustable circuit, an output end of the power conversion circuit is connected to the impedance adjustable circuit. The optimizer 1102 is specifically configured to: adjust an impedance of the impedance adjustable circuit to a third impedance when the optimizer 1102 does not satisfy the start condition, where the third impedance is determined based on an equivalent impedance of the power conversion circuit when the power conversion circuit does not satisfy the start condition and the first impedance; or adjust an impedance of the impedance adjustable circuit to a fourth impedance when the optimizer 1102 satisfies the start condition, where the fourth impedance is determined based on an equivalent impedance of the power conversion circuit when the power conversion circuit satisfies the start condition and the second impedance.

The impedance adjustable circuit may be implemented by using, but is not limited to using, the structure shown in FIG. 3, FIG. 4, FIG. 5a, or FIG. 5b. When the impedance adjustable circuit is implemented by using the structure shown in FIG. 3, FIG. 4, FIG. 5a, or FIG. 5b, for a method for controlling the output impedance of the impedance adjustable circuit by the optimizer 1102, reference may be made to the method for controlling a corresponding output impedance of the impedance adjustable circuit by the control circuit 230 in the foregoing apparatus embodiments. Details are not described herein again.

In a scenario in which the optimizer 1102 includes a boost circuit, the optimizer 1102 is specifically configured to: control, when the optimizer 1102 does not satisfy the start condition, a status of a first-type switch to change according to a first law, where the first-type switch is a switch that can change an output impedance of the boost circuit and that is in the boost circuit, and the first law is determined based on the first impedance; or control, when the optimizer 1102 satisfies the start condition, a status of a first-type switch to change according to a second law, where the second change law is determined based on the second impedance.

Further, when satisfying the start condition, the optimizer 1102 is further configured to control a second-type switch to be in an off state, where the second-type switch is a switch, in the boost circuit, that is directly connected to a power source.

In a scenario in which the optimizer 1102 includes a buck circuit, the optimizer 1102 is specifically configured to: control, when the optimizer 1102 does not satisfy the start condition, a status of a first-type switch to change according to a first law, where the first-type switch is a switch that can change an output impedance of the buck circuit and that is in the buck circuit, and the first law is determined based on the first impedance; or control, when the optimizer 1102 satisfies the start condition, a status of a first-type switch to change according to a second law, where the first-type switch is a switch that can change an output impedance of the buck circuit and that is in the buck circuit, and the second law is determined based on the second impedance.

Further, when satisfying the start condition, the optimizer 1102 is further configured to control a second-type switch to be in an off state, where the second-type switch is a switch, in the buck circuit, configured to directly connect to a power source.

In a scenario in which the optimizer 1102 includes a buck-boost circuit, the optimizer 1102 is specifically configured to: control, when the optimizer 1102 does not satisfy the start condition, a status of a first-type switch to change according to a first law, where the first-type switch is a switch that can change an output impedance of a power conversion apparatus and that is in the buck-boost circuit, and the first law is determined based on the first impedance; or control, when the optimizer 1102 satisfies the start condition, a status of a first-type switch to change according to a second law, where the second change law is determined based on the second impedance.

Further, when satisfying the start condition, the optimizer 1102 is further configured to control a second-type switch to be in an off state, where the second-type switch is a switch, in the buck-boost circuit, that is directly connected to a power source.

It should be noted that quantities of photovoltaic modules and optimizers included in the photovoltaic power system are not limited in this embodiment. The photovoltaic power system may include one or more (two or more) photovoltaic modules 1101 and one or more (two or more) optimizers 1102.

Embodiments provided herein are described with reference to the flowcharts and/or block diagrams of the method, the device (system), and the computer program product according to the embodiments provided herein. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of another programmable data processing device to generate a machine, so that the instructions executed by the computer or the processor of the another programmable data processing device generate an apparatus for implementing a specific function in one or more processes in the flowcharts and/or in one or more blocks in the block diagrams.

These computer program instructions may alternatively be stored in a computer-readable memory that can instruct a computer or another programmable data processing device to work in a specific manner, so that the instructions stored in the computer-readable memory generate an artifact that includes an instruction apparatus. The instruction apparatus implements a specific function in one or more processes in the flowcharts and/or in one or more blocks in the block diagrams.

These computer program instructions may alternatively be loaded onto a computer or another programmable data processing device, so that a series of operations and steps are performed on the computer or the another programmable device, thereby generating computer-implemented processing. Therefore, the instructions executed on the computer or the another programmable device provide steps for implementing a specific function in one or more processes in the flowcharts and/or in one or more blocks in the block diagrams.

Obviously, persons skilled in the art can make various modifications and variations to the embodiments provided herein without departing from the spirit and scope of the embodiments. The present description is intended to cover these modifications and variations provided that they fall within the scope of protection defined by the following claims and their equivalent technologies.

What is claimed is:

1. A power conversion apparatus, comprising a power conversion circuit, an impedance adjustable circuit comprising a switch and a load circuit, and a control circuit configured to control the switch, wherein the control circuit is connected to both the power conversion circuit and the impedance adjustable circuit, an input end of the power conversion circuit is configured to connect to a power source, and an output end of the power conversion circuit is connected to the impedance adjustable circuit;
   the power conversion circuit is configured to adjust output power of the power conversion circuit under the control of the control circuit;
   the impedance adjustable circuit is configured to adjust an output impedance of the impedance adjustable circuit under the control of the control circuit;
   the control circuit is configured to determine whether or not the power conversion apparatus satisfies a start condition; and
   the control unit is configured to, upon a determination that the power conversion apparatus does not satisfy a start condition, control the impedance adjustable circuit to adjust the impedance of the impedance adjustable circuit to a first impedance, and upon a determination that the power conversion apparatus satisfies a start condition, control the impedance adjustable circuit to adjust the impedance of the impedance adjustable circuit to a second impedance, wherein the first impedance is not equal to the second impedance.

2. The apparatus according to claim 1, wherein the start condition is that an input power of the power conversion apparatus is greater than or equal to a minimum power-on operating power of the control circuit.

3. The apparatus according to claim 1, wherein the impedance adjustable circuit is connected in series to the power conversion circuit, the impedance adjustable circuit comprises a first switch and a first load circuit, the first switch is connected in parallel to the first load circuit, and the first switch is further connected to the control circuit; and
   upon the determination that the power conversion apparatus does not satisfy the start condition, the control circuit is configured to control the first switch to be in a first state; or upon the determination that the power conversion apparatus satisfies the start condition, the control circuit is configured to control the first switch to be in a second state, wherein the second state is a state different from the first state.

4. The apparatus according to claim 3, wherein the first state is an off state, and the second state is an on state or a state of switching between the off state and the on state according to a specified law; or
   the first state is the on state, and the second state is the off state or the state of switching between the off state and the on state according to the specified law.

5. The apparatus according to claim 3, wherein
   upon determination that the power conversion apparatus satisfies the start condition, after the control circuit is configured to control the first switch to be in the second state, the control circuit is further configured to: receive first instruction information, and control, according to the first instruction information, the first switch to be in a third state, wherein the third state is a state different from the second state; or
   upon determination that the power conversion apparatus satisfies the start condition, after the control circuit is configured to control the first switch to be in the second state, the control circuit is further configured to: detect whether a voltage, a current, or power of an output end of the power conversion apparatus has changed; and upon determination that the voltage, the current, or the power of the output end of the power conversion apparatus has changed, control the first switch to be in a third state, wherein the third state is a state different from the second state.

6. The apparatus according to claim 1, wherein the impedance adjustable circuit is connected in parallel to the power conversion circuit, the impedance adjustable circuit comprises a second switch and a second load circuit, the second switch is connected in series to the second load circuit, and the second switch is further connected to the control circuit; and
   the control circuit is configured to, upon determination that the power conversion apparatus does not satisfy the start condition, control the second switch to be in a first state; or, upon determination that the power conversion apparatus satisfies the start condition, control the second switch to be in a second state, wherein the second state is a state different from the first state.

7. The apparatus according to claim 6, wherein the first state is an off state, and the second state is an on state or switching between an off state and an on state according to a specified law; or the first state is an on state, and the second state is an off state or switching between an off state and an on state according to a specified law.

8. The apparatus according to claim 6, wherein upon determination that the power conversion apparatus satisfies the start condition, after the control circuit is configured to control the second switch to be in the second state, the control circuit is further configured to: receive first instruction information, and control, according to the first instruction information, the second switch to be in a third state, wherein the third state is a state different from the second state; or upon determination that the power conversion apparatus satisfies the start condition, after the control circuit is configured to control the second switch to be in the second state, the control circuit is further configured to: detect whether a voltage, a current, or power of an output end of the power conversion apparatus has changed; and upon determination that the voltage, the current, or the power of the output end of the power conversion apparatus has changed, control the second switch to be in a third state, wherein the third state is a state different from the second state.

9. The apparatus according to claim 1, wherein the impedance adjustable circuit comprises a first impedance adjustable circuit and a second impedance adjustable circuit, a first end of the first impedance adjustable circuit is connected in series to a first output end of the power conversion circuit, and the second impedance adjustable circuit is connected in parallel between a second end of the first impedance adjustable circuit and a second output end of the power conversion circuit, or the second impedance adjustable circuit is connected in parallel to the power conversion circuit, and the first impedance adjustable circuit is connected in series to the second impedance adjustable circuit, wherein the first impedance adjustable circuit comprises a first switch and a first load circuit, the first switch is connected in parallel to the first load circuit, the impedance adjustable circuit comprises a second switch and a second load circuit, the second switch is connected in series to the second load circuit, and the first switch and the second switch are further connected to the control circuit;

upon determination that the power conversion apparatus does not satisfy the start condition, the control circuit is configured to control the first switch to be in a first state, and is configured to control the second switch to be in a first state or a second state, wherein the second state is a state different from the first state; or upon determination that the power conversion apparatus satisfies the start condition, the control circuit is configured to control at least one of the first switch and the second switch to be in a state that is different from a state corresponding to the at least one switch when the power conversion apparatus does not satisfy the start condition.

10. The apparatus according to claim 9, wherein the first state is an off state, the second state is an on state, a state different from the first state is the on state or a state of switching between the off state and the on state according to a first law, and a state different from the second state is the off state or the state of switching between the off state and the on state according to a second law; or the first state is the off state, the second state is the off state, the state different from the first state is the on state or a state of switching between the off state and the on state according to a first law, and the state different from the second state is the on state or a state of switching between the off state and the on state according to the second law; or the first state is the on state, the second state is the off state, the state different from the first state is the off state or the state of switching between the off state and the on state according to the first law, and the state different from the second state is the on state or the state of switching between the off state and the on state according to the second law; or the first state is the on state, the second state is the on state, the state different from the first state is the off state or the state of switching between the off state and the on state according to the first law, and the state different from the second state is the off state or the state of switching between the off state and the on state according to the second law.

11. The apparatus according to claim 9, wherein upon determination that the power conversion apparatus satisfies the start condition, after the control circuit is configured to control the at least one of the first switch and the second switch to be in the state that is different from the state corresponding to the at least one switch when the power conversion apparatus does not satisfy the start condition, the control circuit is further configured to: receive first instruction information, and control, according to the first instruction information, at least one of the first switch and the second switch to be in a state that is different from a state corresponding to the at least one switch when the power conversion apparatus satisfies the start condition; or upon determination that the power conversion apparatus satisfies the start condition, after the control circuit is configured to control the at least one of the first switch and the second switch to be in the state that is different from the state corresponding to the at least one switch when the power conversion apparatus does not satisfy the start condition, the control circuit is further configured to: detect whether a voltage, a current, or power of an output end of the power conversion apparatus has changed; and upon determination that the voltage, the current, or the power of the output end of the power conversion apparatus has changed, control at least one of the first switch and the second switch to be in a state that is different from a state corresponding to the at least one switch when the power conversion apparatus satisfies the start condition.

12. A method for controlling an output impedance of a power conversion apparatus comprising a power conversion circuit, an impedance adjustable circuit comprising a switch and a load circuit, and a control circuit, the control circuit connected to both the power conversion circuit and the impedance adjustable circuit, and an output end of the power conversion circuit being connected to the impedance adjustable circuit, the method comprising steps of:

determining whether or not the power conversion apparatus satisfies a start condition;

adjusting the output impedance of the power conversion apparatus to a first impedance upon determination that the power conversion apparatus does not satisfy the start condition; or adjusting the output impedance of the power conversion apparatus to a second impedance upon determination that the power conversion apparatus satisfies the start condition, wherein the first impedance is not equal to the second impedance.

13. The method according to claim 12, wherein:

the adjusting the output impedance of the power conversion apparatus to a first impedance upon determination that the power conversion apparatus does not satisfy a start condition comprises:
adjusting an impedance of the impedance adjustable circuit to a third impedance upon determination that the power conversion apparatus does not satisfy the start condition, wherein the third impedance is determined based on an equivalent impedance of the power conversion circuit upon determination that the power conversion circuit does not satisfy the start condition and the first impedance; and
the adjusting the output impedance of the power conversion apparatus to a second impedance upon determination that the power conversion apparatus satisfies a start condition comprises:
adjusting an impedance of the impedance adjustable circuit to a fourth impedance upon determination that the power conversion apparatus satisfies the start condition, wherein the fourth impedance is determined based on an equivalent impedance of the power conversion circuit upon determination that the power conversion circuit satisfies the start condition and the second impedance.

14. The method according to claim 12, wherein the power conversion apparatus comprises a buck circuit;
the adjusting the output impedance of the power conversion apparatus to a first impedance upon determination that the power conversion apparatus does not satisfy a start condition comprises:
controlling, upon determination that the power conversion apparatus does not satisfy the start condition, a status of a first-type switch to change according to a first law, wherein the first-type switch is a switch that can change an output impedance of the buck circuit and that is in the buck circuit, and the first law is determined based on the first impedance; and
the adjusting the output impedance of the power conversion apparatus to a second impedance upon determination that the power conversion apparatus satisfies a start condition comprises:
controlling, upon determination that the power conversion apparatus satisfies the start condition, a status of a first-type switch to change according to a second law, wherein the second law is determined based on the second impedance.

15. The method according to claim 14, wherein the buck circuit comprises a first capacitor, a first switch, a second switch, an inductor, and a second capacitor; and a first end of the first capacitor is connected to a first end of the first switch, a second end of the first switch is connected to both a first end of the inductor and a first end of the second switch, a third end of the first switch is configured to input a signal for controlling a status of the first switch, a second end of the second switch is connected to both a second end of the first capacitor and a first end of the second capacitor, a third end of the second switch is configured to input a signal for controlling a status of the second switch, and a second end of the inductor is connected to a second end of the second capacitor; and
the first-type switch is the second switch.

16. The method according to claim 12, wherein the power conversion apparatus comprises a boost circuit;
the adjusting the output impedance of the power conversion apparatus to a first impedance upon determination that the power conversion apparatus does not satisfy a start condition comprises:
controlling, upon determination that the power conversion apparatus does not satisfy the start condition, a status of a first-type switch to change according to a first law, wherein the first-type switch is a switch that can change an output impedance of the boost circuit and that is in the boost circuit, and the first law is determined based on the first impedance; and
the adjusting the output impedance of the power conversion apparatus to a second impedance upon determination that the power conversion apparatus satisfies a start condition comprises:
controlling, upon determination that the power conversion apparatus satisfies the start condition, a status of a first-type switch to change according to a second law, wherein the second change law is determined based on the second impedance.

17. The method according to claim 16, wherein the boost circuit comprises a first capacitor, a first switch, an inductor, a second switch, a third switch, and a second capacitor; and
a first end of the first capacitor is connected to a first end of the first switch, a second end of the first switch is connected to a first end of the inductor, a second end of the inductor is connected to both a first end of the second switch and a first end of the third switch, a second end of the first capacitor is connected to both a second end of the second switch and a first end of the second capacitor, a second end of the third switch is connected to a second end of the second capacitor, a third end of the first switch is configured to input a signal for controlling a status of the first switch, a third end of the second switch is configured to input a signal for controlling a status of the second switch, and a third end of the third switch is configured to input a signal for controlling a status of the third switch; and
the first-type switch is the second switch and the third switch.

18. The method according to claim 12, wherein the power conversion apparatus comprises a buck-boost circuit;
the adjusting the output impedance of the power conversion apparatus to a first impedance upon determination that the power conversion apparatus does not satisfy a start condition comprises:
controlling, upon determination that the power conversion apparatus does not satisfy the start condition, a status of a first-type switch to change according to a first law, wherein the first-type switch is a switch that can change the output impedance of the power conversion apparatus and that is in the buck-boost circuit, and the first law is determined based on the first impedance; and
the adjusting the output impedance of the power conversion apparatus to a second impedance upon determination that the power conversion apparatus satisfies a start condition comprises:
controlling, upon determination that the power conversion apparatus satisfies the start condition, a status of a first-type switch to change according to a second law, wherein the second change law is determined based on the second impedance.

19. The method according to claim 18, wherein the buck-boost circuit comprises a first capacitor, a first switch, a second switch, an inductor, a third switch, a fourth switch, and a second capacitor, wherein
a first end of the first capacitor is connected to a first end of the first switch, a second end of the first capacitor is connected to all of a first end of the second switch, a first end of the third switch, and a first end of the second capacitor, a second end of the first switch is connected to both a first end of the inductor and a second end of the second switch, a second end of the inductor is connected to both a second end of the third switch and a first end of the fourth switch, a second end of the fourth switch is connected to a second end of the second capacitor, a third end of the first switch is configured to input a signal for controlling a status of the first switch, a third end of the second switch is configured to input a signal for controlling a status of the second switch, a third end of the third switch is configured to input a signal for controlling a status of the third switch, and a third end of the fourth switch is configured to input a signal for controlling a status of the fourth switch; and the first-type switch is the third switch and the fourth switch, the first-type switch is the second switch and the fourth switch, or the first-type switch is the second switch, the third switch, and the fourth switch.

20. A photovoltaic power system, comprising a photovoltaic module, an optimizer comprising a power conversion circuit, an impedance adjustable circuit comprising a switch and a load circuit, and a control circuit, the control circuit connected to both the power conversion circuit and the impedance adjustable circuit, and an output end of the power conversion circuit being connected to the impedance adjustable circuit, and an inverter, wherein the photovoltaic module is configured to: convert solar energy into electrical energy, and output the electrical energy to the optimizer;

the optimizer is configured to: adjust an output impedance of the optimizer to a first impedance upon determination that the optimizer does not satisfy a start condition, or adjust an output impedance of the optimizer to a second impedance upon determination that the optimizer satisfies a start condition, wherein the first impedance is not equal to the second impedance; and upon determination that the optimizer satisfies the start condition and the optimizer needs to control output power, adjust output power of the photovoltaic module and output adjusted power; and the inverter is configured to: convert the power output by the optimizer into electrical energy satisfying a specified condition, and output the converted electrical energy to a power grid or a load.

* * * * *

UNITED STATES PATENT AND TRADEMARK OFFICE
CERTIFICATE OF CORRECTION

| | |
|---|---|
| PATENT NO. | : 11,888,321 B2 |
| APPLICATION NO. | : 17/405465 |
| DATED | : January 30, 2024 |
| INVENTOR(S) | : Xiaofeng Yao |

It is certified that error appears in the above-identified patent and that said Letters Patent is hereby corrected as shown below:

On the Title Page

Item (72) Inventors:
Xiofeng Yao, Xi'an(CN)
Should be:
--Xiaofeng Yao, Xi'an(CN)--.

Signed and Sealed this
Second Day of April, 2024

Katherine Kelly Vidal
*Director of the United States Patent and Trademark Office*